(12) United States Patent
Nagarajan et al.

(10) Patent No.: US 11,955,984 B2
(45) Date of Patent: Apr. 9, 2024

(54) ANALOG-TO-DIGITAL CONVERTER (ADC) HAVING SELECTIVE COMPARATOR OFFSET ERROR TRACKING AND RELATED CORRECTIONS

(71) Applicant: TEXAS INSTRUMENTS INCORPORATED, Dallas, TX (US)

(72) Inventors: Viswanathan Nagarajan, Bengaluru (IN); Aniket Datta, Bengaluru (IN); Nithin Gopinath, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 128 days.

(21) Appl. No.: 17/828,967

(22) Filed: May 31, 2022

(65) Prior Publication Data

US 2023/0387933 A1    Nov. 30, 2023

(51) Int. Cl.
 H03M 1/10    (2006.01)
(52) U.S. Cl.
 CPC .................................. H03M 1/1014 (2013.01)
(58) Field of Classification Search
 CPC .............................. H03M 1/10; H03M 1/1014
 See application file for complete search history.

(56) References Cited

U.S. PATENT DOCUMENTS

| | | | | |
|---|---|---|---|---|
| 5,309,157 A * | 5/1994 | Yee | ....................... | H03M 1/141 341/119 |
| 5,319,372 A * | 6/1994 | Yee | ....................... | H03M 1/141 341/141 |
| 5,324,995 A * | 6/1994 | Yee | .......................... | H03K 5/08 327/91 |
| 5,341,137 A * | 8/1994 | Yee | ....................... | H03M 1/141 341/141 |
| 5,367,202 A * | 11/1994 | Yee | ......................... | G05F 3/262 327/306 |
| 5,392,045 A * | 2/1995 | Yee | ....................... | H03M 1/141 327/334 |
| 7,283,074 B2 * | 10/2007 | Sheng | .................... | H04N 5/455 341/120 |
| 7,453,381 B2 * | 11/2008 | Doerrer | ................ | H03M 3/424 341/143 |

(Continued)

Primary Examiner — Lam T Mai
(74) Attorney, Agent, or Firm — Valerie M. Davis; Frank D. Cimino

(57) ABSTRACT

An analog-to-digital converter (ADC) includes: a set of comparators configured to provide comparison results based on an analog signal and respective reference thresholds for comparators of the set of comparators; digitization circuitry configured to provide a digital output code based on the comparison results and a mapping; and calibration circuitry. The calibration circuitry is configured to: receive the comparison results; determine if the analog signal is proximate to one of the respective reference thresholds based on the comparison results; in response to determining the analog signal is proximate to one of the respective reference thresholds, receive ADC values based on different pseudorandom binary sequence (PRBS) values being applied to the analog signal; determine an offset error based on the ADC values; and provide a comparator input offset calibration signal at a calibration circuitry output if the estimated offset error is greater than an offset error threshold.

20 Claims, 8 Drawing Sheets

(56) References Cited

U.S. PATENT DOCUMENTS

| | | | |
|---|---|---|---|
| 7,907,079 B1* | 3/2011 | Galloway | H03M 1/1014 341/169 |
| 9,543,974 B1* | 1/2017 | Yang | H03M 1/0863 |
| 9,998,134 B1* | 6/2018 | Stepanovic | H03M 1/1014 |
| 2008/0150782 A1* | 6/2008 | Augusto | H04N 25/76 341/155 |
| 2011/0090103 A1* | 4/2011 | Hotta | H03M 1/144 341/110 |
| 2012/0194367 A1* | 8/2012 | Wang | H03M 1/1014 341/158 |
| 2012/0319877 A1* | 12/2012 | Ali | H03M 1/1014 341/110 |
| 2013/0141260 A1* | 6/2013 | Lai | H03M 1/1014 341/110 |
| 2016/0065230 A1* | 3/2016 | Mulder | H03M 1/34 341/158 |
| 2018/0167079 A1* | 6/2018 | Ding | H03M 1/462 |
| 2019/0007071 A1* | 1/2019 | Nagarajan | H03M 1/1014 |
| 2019/0043477 A1* | 2/2019 | Bang | G10L 15/20 |
| 2019/0285468 A1* | 9/2019 | Berkovich | H04N 25/57 |

* cited by examiner

ANALOG-TO-DIGITAL CONVERTER (ADC) HAVING SELECTIVE COMPARATOR OFFSET ERROR TRACKING AND RELATED CORRECTIONS

BACKGROUND

Many electronic systems include an analog-to-digital converter (ADC), which converts an analog input signal to a digital output signal. The performance (e.g., power consumption, speed, accuracy) and area of different ADC topologies varies. One example ADC topology is a delay domain ADC topology, which enables high-speed operation with power and area advantages compared to other ADC topologies (e.g., pipeline or successive-approximation (SAR) topologies). Examples of such ADC topology are illustrated in U.S. Pat. Nos. 10,284,188, 10,673,456, 10,673,452, and 10,673,453, all of which are hereby incorporated by reference in their entirety. The delay domain ADC topology uses comparators and folding circuitry to provide a transfer function that converts an analog signal sample (e.g., a voltage domain sample based on the analog input signal or a scaled version of the analog input signal) to a delay domain sample. This is a highly nonlinear operation. To account for such nonlinearity, a calibration that uses known inputs is used to determine an inverse mapping that will correct for nonlinear distortion. Examples of such calibration are illustrated in U.S. patent application Ser. No. 17/126,157 (filed on Dec. 18, 2020); Ser. No. 17/158,526 (filed on Jan. 26, 2021); Ser. No. 17/133,745 (filed on Dec. 24, 2020); Ser. No. 17/467,561 (filed on Sep. 7, 2021); Ser. No. 17/568,972 (filed on Jan. 5, 2022) and Ser. No. 17/588,493 (filed on Jan. 31, 2022), all of which are hereby incorporated by reference in their entirety.

However, such calibrations do not adequately account for comparator flicker noise, which may vary over time and changes the intended transfer function of a delay domain ADC (resulting in a lower accuracy ADC). One option to reduce ADC output error arising from comparator flicker noise uses chopper circuitry to add dither noise (random noise) to the analog signal and/or the ADC output to reduce the effect of the flicker noise (effectively spreading the spectral content of the flicker noise).

FIG. 1 is a diagram of a delay domain ADC topology 100 having chopper circuitry in accordance with a conventional approach. Other examples of chopper circuitry use with ADCs are illustrated in U.S. Pat. App. Pub. No. 2011/0063146 (filed on Sep. 15, 2009). In FIG. 1, the chopper circuitry includes a +1/−1 pseudorandom binary sequence (PRBS) generator 114, a multiplier 104, and a multiplier 112. The PRBS generator 114 is configured to apply different PRBS values (e.g., +1 or −1) to respective first inputs of the multipliers 104 and 112. As shown, the ADC topology 100 also includes a buffer circuit 102, where the output of the buffer circuit 102 is coupled to a second input of the multiplier 104. The multiplier 104 is configured to multiply the output of the buffer circuit 102 by a PRBS value (e.g., +1 or −1), and the output of the multiplier 104 is coupled to respective inputs of a set of N comparators 106. Each comparator of the set of N comparators 106 has a respective reference threshold and is subject to a different level of flicker noise over time. The ADC topology 100 also includes: folding circuitry 108 coupled to the outputs of the set of N comparators 106; and digitization circuitry 110 coupled to the output of the folding circuitry 108.

In the example of FIG. 1, the output of the folding circuitry 108 is a delay domain signal. The delay domain signal is provided to the digitization circuitry 110, which is configured to provide a digital output code based on time parameters (e.g., the period between two rising edges) of the delay domain signal. In operation, the set of N comparators 106, the folding circuitry 108, and the digitization circuitry 110 provide a transfer function to convert an analog signal sample to a digital output code. The digital output code provided by the digitization circuitry 110 is coupled to a second input of the multiplier 112, which multiplies the digital output code by a PRBS value from the +/−1 PRBS generator 114. The output of the multiplier 112 is the digital output of the ADC topology 100.

With the operations of chopper circuitry as in FIG. 1, linearity error arising from comparator flicker noise related to the set of N comparators 106 is reduced by dithering, but there is still some overall ADC noise degradation due to the addition of random noise. To summarize, comparator flicker noise can be considered part of the respective comparator input offset for each comparator of the set of N comparators 106. While chopper circuitry operations are able to reduce linearity error in the ADC output due to comparator flicker noise as described with regard to FIG. 1 the chopper circuitry operations increase the overall noise and may increase each respective comparator input offset. The amount of offset error (e.g., the change in comparison result steps or digital output code steps due to a given comparator input offset) varies as a function of the analog signal sample value and the comparator input offset, which is affected by variable flicker noise, dither noise, and/or other noise.

SUMMARY

In one example embodiment, an analog-to-digital converter (ADC) comprises a set of comparators, each comparator of the set of comparators having a first input, a second input and an output. The set of comparators is configured to: receive an analog signal at each of the first inputs; receive at the second input for each comparator of the set of comparators a respective reference threshold; and provide comparison results at each output based on the analog signal and the respective reference thresholds. The ADC also comprises digitization circuitry having a digitization circuitry input and a digitization circuitry output. The digitization circuitry input is coupled to each of the outputs. The digitization circuitry is configured to provide a digital output code at the digitization circuitry output based on the comparison results and a mapping. The ADC also comprises calibration circuitry having a first calibration circuitry input, a second calibration circuitry input and a calibration circuitry output. The calibration circuitry is configured to: receive the comparison results at the first calibration circuitry input; determine if the analog signal is proximate to one of the respective reference thresholds based on the comparison results; in response to determining the analog signal is proximate to one of the respective reference thresholds, receive ADC values at the second calibration circuitry input, the ADC values based on different pseudorandom binary sequence (PRBS) values being applied to the analog signal; estimate an offset error based on the ADC values; and provide a comparator input offset calibration signal at the calibration circuitry output if the estimated offset error is greater than an offset error threshold.

In another example embodiment, a ADC comprises: a first set of comparators configured to receive an analog signal and to provide first comparison results based on the analog signal and respective reference thresholds for comparators of the first set of comparators; digitization circuitry coupled to an output of the first set of comparators and configured to provide a digital output code based on the comparison results and a mapping; a second set of comparators configured to receive the analog signal and to provide second comparison results based on the analog signal and respective reference thresholds for comparators of the second set of comparators; and calibration circuitry coupled to the set of comparators. The calibration circuitry is configured to: receive the first and second comparison results; determine if the analog signal is proximate to one of the respective reference thresholds based on the first and second comparison results; in response to determining the analog signal is proximate to one of the respective reference thresholds, obtain ADC values based on different PRBS values being applied to the analog signal; estimate an offset error based on the obtained ADC values; and provide a comparator input offset calibration signal for at least one comparator of the set of comparators responsive to the estimated offset error being greater than an offset error threshold.

In another example embodiment, a method of operating an ADC comprises: obtaining, by the ADC, an analog signal; comparing, by the ADC, the analog signal to respective reference thresholds of a set of comparators of the ADC to obtain comparison results; determining if the analog signal is proximate to one of the respective reference thresholds based on the comparison results; obtaining ADC values based on different PRBS values being applied to the analog signal responsive to the analog signal being proximate to one of the respective reference thresholds; determining an offset error based on the ADC values; and providing a comparator input offset calibration signal to calibrate at least one comparator of the set of comparators responsive to the estimated offset error being greater than an offset error threshold.

BRIEF DESCRIPTION OF THE DRAWINGS

The same reference numbers (or other reference designators) are used in the drawings to designate the same or similar (structurally and/or functionally) features.

DETAILED DESCRIPTION

Figure 2A:
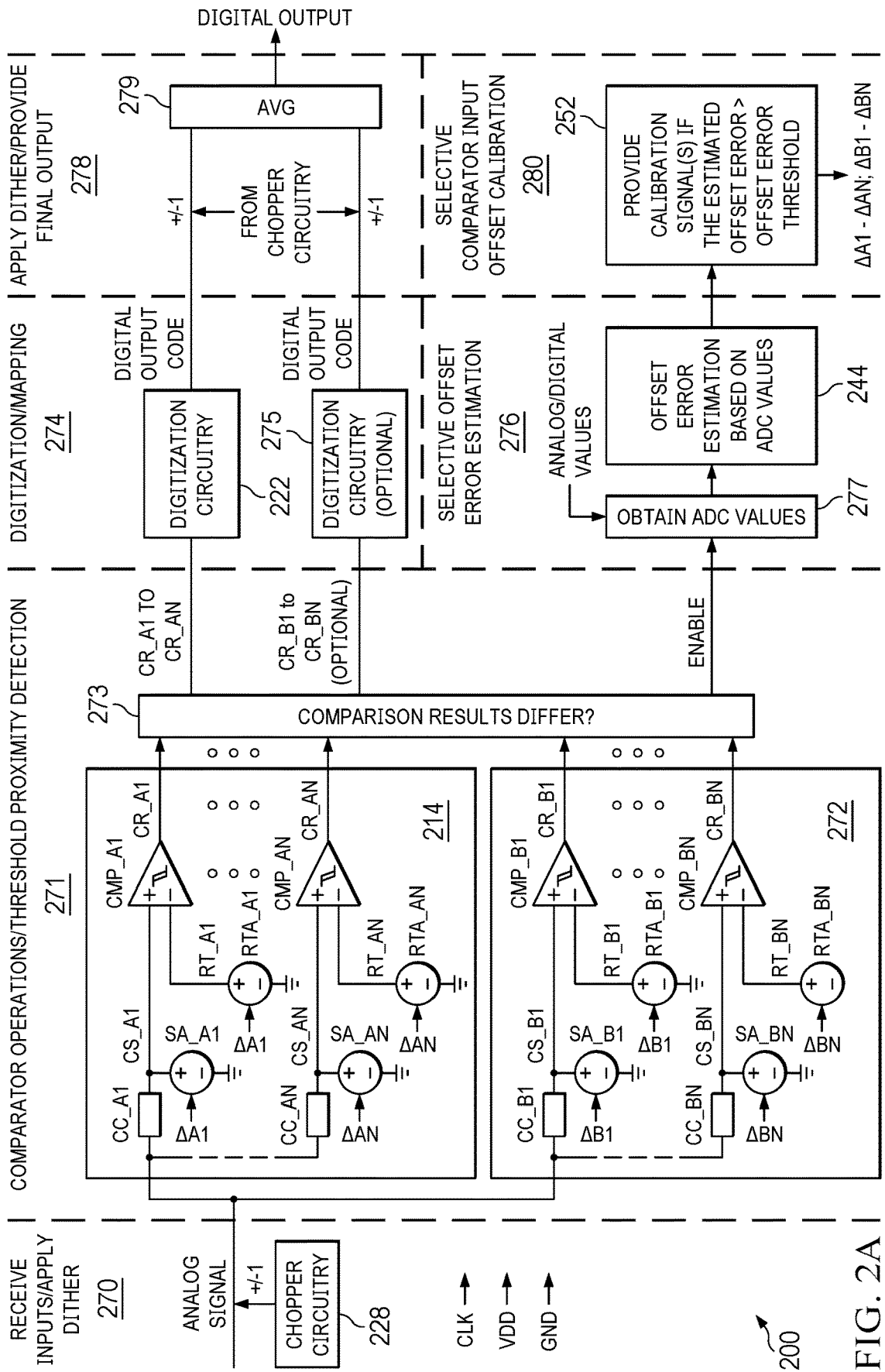
FIG. 2A is a diagram of an ADC and related operations in accordance with an example embodiment.

FIG. 2A is a diagram of an ADC 200 and related operations in accordance with an example embodiment. For the ADC 200, various stages 270, 271, 274, 276, 278 and 280 of ADC operations are represented with related example components. Stage 270 is a receive inputs and apply dither stage. Stage 271 is a comparator operations and threshold proximity detection stage. Stage 274 is a digitization and mapping stage. Stage 276 is a selective offset error estimation stage. Stage 278 is an apply dither and provide output stage. Stage 280 is a selective comparator input offset calibration stage. In some embodiments, stages 271, 276, and 280 (and the operations, thereof) may improve ADC accuracy while managing error estimation and related calibration overhead.

In stage 270, an analog signal is received and chopper circuitry 228 is configured to perform dithering by applying random noise (e.g., +1 or −1) via multiplication (e.g., by a multiplier or other circuitry and/or software, not shown) to the analog signal. The analog signal may be the analog input signal to the ADC 200 or a buffered/scaled signal. As shown, a clock signal (CLK), a power supply signal (VDD), and ground (GND) are also received by the ADC 200. CLK determines the timing/frequency of analog signal samples and the digital output signal for the ADC 200. For different example embodiments, value of CLK may vary.

In stage 271, the analog signal, modified by the operations of the chopper circuitry 228, is provided to a first set of comparators 214 and a second set of comparators 272. The first set of comparators 214 includes one or more (for example, an integer number, N) comparators (labeled CMP_A1 to CMP_AN). As shown, each comparator of the first set of comparators 214 has a non-inverting (+) input and an inverting (−) input. Each non-inverting input related the first set of comparators 214 is configured to receive an analog signal (e.g., the analog input signal or a scaled version of the analog input signal) from which analog signal samples (labeled CS_A1 to CS_AN) are obtained. In some example embodiments, each sample is obtained based on a clock signal being provided to each comparator of the first set of comparators 214 and related sampling circuitry included with each comparator of the first set of comparators 214. In different example embodiments, an adjustment or calibration to a single sample or multiple samples is possible using respective sample adjustment circuitry (labeled SA_A1 to SA_AN) and respective control signals (labeled ΔA1 to ΔAN). Without limitation, the sample adjustment circuitry for each comparator of the first set of comparators 214 may include an adjustable voltage source. Current control circuitry (labeled CC_A1 to CC_AN) may also be used to enable sample adjustment for a given comparator of the first set of comparators 214 without affecting the respective sample for other comparators. Without limitation, the current control circuitry for each comparator of the second set of comparators 214 may include a diode, a switch, or another directional current control component.

As shown, each inverting input related the first set of comparators 214 is configured to receive a respective reference threshold (labeled RT_A1 to RT_AN). In different example embodiments, an adjustment or calibration to a single reference threshold or multiple reference thresholds is possible using respective reference threshold adjustment circuitry (labeled RTA_A1 to RTA_AN) and respective control signals (labeled ΔA1 to ΔAN) for comparators of the first set of comparators 214. Without limitation, the reference threshold adjustment circuitry for each comparator of the first set of comparators 214 may include an adjustable reference voltage source. Based on the reference threshold adjustment circuitry (RTA_A1 to RTA_AN), each comparator of the first set of comparators 214 is configured to receive a respective reference threshold (labeled RT_A1 to RT_AN) at its inverting input. Although FIG. 2A shows the same set of control signals (ΔA1 to ΔAN) being applied to the sample adjustment circuitry (SA_A1 to SA_AN) and the reference threshold adjustment circuitry (RTA_A1 to RTA_AN), it is possible to use different control signals for each sample adjustment circuitry and each reference threshold adjustment circuitry. As another option, either the sample adjustment circuitry or the reference threshold adjustment circuitry could be omitted in some example embodiments. In other embodiments, the reference voltages (RTA_A1 to RTA_AN) may be obtained using a voltage source and a resistive divider.

In operation, each comparator of the first set of comparators 214 is configured to compare its respective analog signal sample with its respective reference threshold and provide a comparison result (labeled CR_A1 to CR_AN) indicating if the respective sample is greater than or less than its respective reference threshold. The comparison results (CR_A1 to CR_AN) of the first set of comparators 214 are provided to stage 274 of the ADC 200 as part of a transfer function to convert each analog signal sample to a digital output. The comparison results (CR_A1 to CR_AN) of the first set of comparators 214 may also be used for threshold proximity detection operations of the stage 271. In some example embodiments, the threshold proximity detection operations of the stage 271 involve the second set of comparators 272, where each comparator of the second set of comparators 272 functions as a reference comparator for a respective comparator of the first set of comparators 214.

The second set of comparators 272 includes one or more (for example, an integer number, N) comparators (labeled CMP_B1 to CMP_BN). As shown, each comparator of the second set of comparators 272 has a non-inverting (+) input and an inverting (−) input. Each non-inverting input of the second set of comparators 272 is configured to receive the analog signal (e.g., the analog input signal or a scaled version of the analog input signal) from which respective sample (labeled CS_B1 to CS_BN) are obtained. In some example embodiments, each sample is obtained based on a clock signal being provided to each comparator of the second set of comparators 272 and related sampling circuitry included with each comparator of the second set of comparators 272. In different example embodiments, an adjustment or calibration to a single sample or multiple samples is possible using respective sample adjustment circuitry (labeled SA_B1 to SA_BN) and respective control signals (labeled ΔB1 to ΔBN). Without limitation, the sample adjustment circuitry for each comparator of the second set of comparators 272 may include an adjustable voltage source. Current control circuitry (labeled CC_B1 to CC_BN) may also be used to enable sample adjustment for a given comparator of the second set of comparators 272 without affecting the respective sample for other comparators. Without limitation, the current control circuitry for each comparator of the second set of comparators 272 may include a diode, a switch, or another directional current control component.

As shown, each inverting input related the second set of comparators 272 is configured to receive a respective reference threshold (labeled RT_B1 to RT_BN). In different example embodiments, an adjustment or calibration to a single reference threshold or multiple reference thresholds is possible using respective reference threshold adjustment circuitry (labeled RTA_B1 to RTA_BN) and respective control signals (labeled ΔB1 to ΔBN) for comparators of the second set of comparators 272. Without limitation, the reference threshold adjustment circuitry for each comparator of the second set of comparators 272 may include an adjustable reference voltage source. Based on the reference threshold adjustment circuitry (RTA_B1 to RTA_BN), each comparator of the second set of comparators 272 is configured to receive a respective reference threshold (labeled RT_B1 to RT_BN) at its inverting input. In operation, each comparator of the second set of comparators 272 is configured to compare its respective sample with its respective reference threshold and provide a comparison result (labeled CR_B1 to CR_BN) indicating if the respective sample is greater than or less than its respective reference threshold. In other embodiments, the reference voltages (RTA_B1 to RTA_BAN) may be obtained using a voltage source and a resistive divider.

In the example of FIG. 2A, the comparison results (CR_A1 to CR_AN) from the first set of comparators 214 and the comparison results (CR_B1 to CR_BN) from the second set of comparators 272 are provided to comparison result logic 273. The comparison result circuitry 273 is configured to compare individual results (e.g., compare CR_A1 with CR_B1, CR_A2 with CR_B2, CR_A3 with CR_B3, and so on) and/or group results (e.g., compare CR_A1 to CR_AN with CR_B1 to CR_BN) using circuitry such as logic gates, a processor, or other circuitry configured to compare individual values or a sequence of values related to the comparisons results (CR_A1 to CR_AN) from the first set of comparators 214 and the comparison results (CR_B1 to CR_BN) from the second set of comparators 272. If there is a difference between the comparison result of a given comparator (e.g., CMP_A1) of the first set of comparators 214 relative to the comparison result of its reference comparator (e.g., CMP_B1 is the reference comparator for CMP_A1) of the second set of comparators 272, the comparison result circuitry 273 is configured to provide an enable signal to initiate stage 276. Otherwise, if there is no difference between the comparison result of a given comparator (e.g., CMP_A1) of the first set of comparators 214 relative to the comparison result of its reference comparator (e.g., CMP_B1 is the reference comparator for CMP_A1) of the second set of comparators 272, the comparison result circuitry 273 does not provide the enable signal and stage 276 is not initiated. Whether or not stage 276 is initiated, the comparison results (CR_A1 to CR_AN) from the first set of comparators 214 are provided to first digitization circuitry 222 of stage 274. Whether or not stage 276 is initiated, the comparison results (CR_B1 to CR_BN) from the second set of comparators 272 are optionally provided to second digitization circuitry 275 of stage 274.

The digitization circuitry 222 of stage 274 is configured to provide a digital output code based on the comparison results (CR_A1 to CR_AN) from the first set of comparators 214. When used, the digitization circuitry 275 of stage 274 is configured to provide a digital output code based on the comparison results (CR_B1 to CR_BN) from the second set of comparators 272. The digital output code(s) from stage 274 is(are) provided to stage 278, which applies random noise (from the chopper circuitry 228 via, for example, a multiplier or other circuitry and/or software) to the digital output code(s). When both the digitization circuitry 222 and the digitization circuitry 275 are used in stage 274, different sets of chopper circuitry may be used in stage 274 to apply random noise to the digital output codes. Also, an averaging circuit 279 may be used in stage 278 to average the results after random noise has been applied to the digital output codes. In such case, the output of the ADC 200 will be the output of the averaging circuit 279. If the digitization circuitry 275 is not used in stage 274, the digital output code of the digitization circuitry 222, with random noise applied in stage 278, will be the output of the of the ADC 200.

Figure 3:
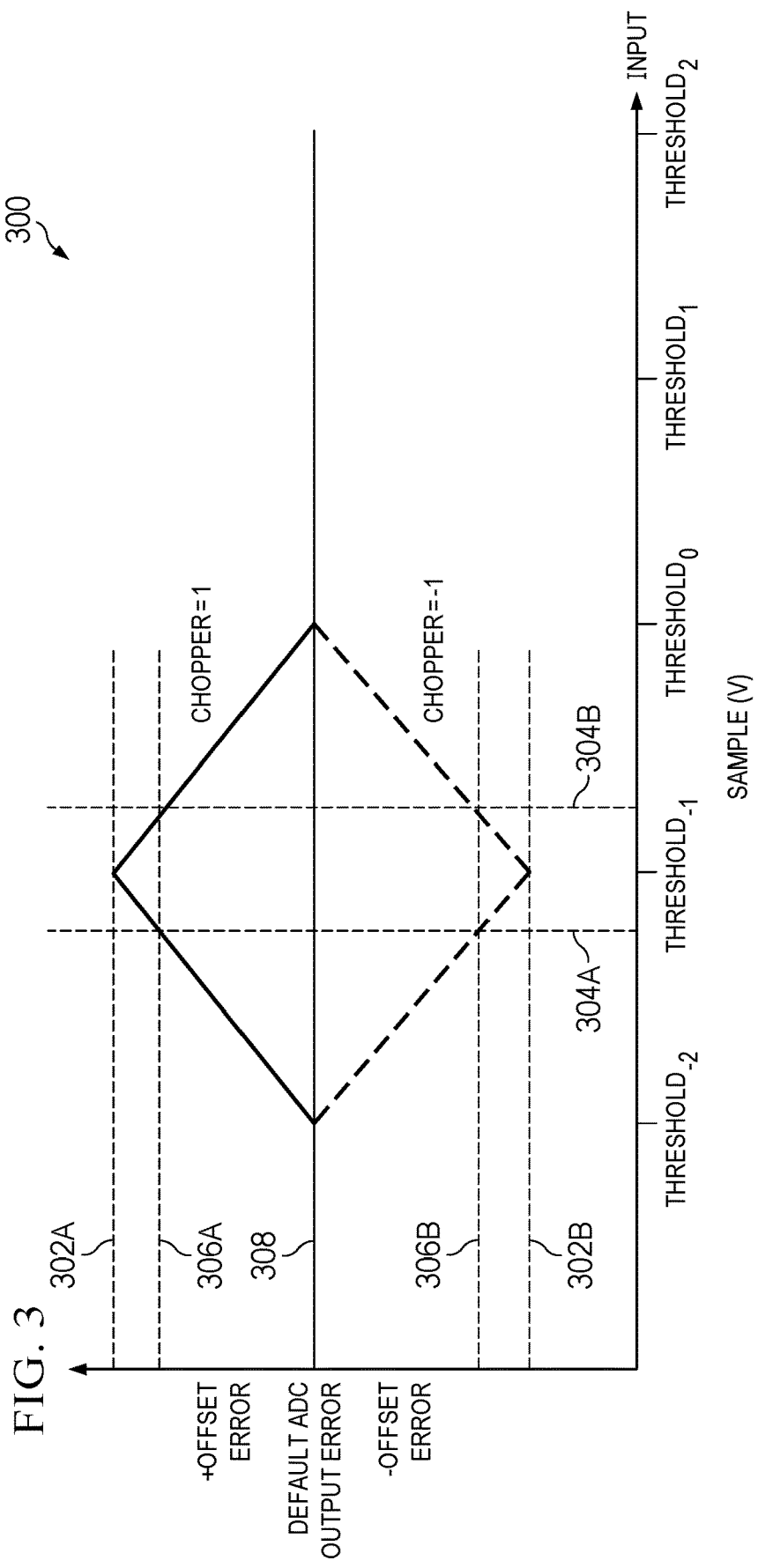
FIG. 3 is a graph showing offset error as a function of analog signal value and chopper value in accordance with example embodiments.

If stage 276 is initiated, ADC values are obtained by circuitry 277. In some example embodiments, the circuitry 277 is a microcontroller, a processor, or other programmable circuitry configured to interact with the components of stage 270, stage 271, stage 274, and/or stage 278 to obtain ADC values based on the application of the different random noise options (e.g., +1 and −1) to a target sample proximate to a reference threshold (e.g., as determined in stage 271) or related values (e.g., the comparison results or digital output code related to the target sample). In some example embodiments, the ADC values are analog values (e.g., the comparison results from the first set of comparators 214 and, possibly, the comparison results of the second set of comparators 272) or related digital values (e.g., the digital outputs of the digitization circuity 222 and, possibly, the digital outputs of the digitization circuitry 275) when different random noise values (e.g., +1 and −1) are intentionally applied to consider their effect when the target sample is used. In some example embodiments, the operations of stage 276 are performed for a given comparator sample (determined to be proximate to one of the reference thresholds) from the operations of stage 271, because offset error due to comparator input offset is most likely (and highest) when a sample (e.g., CS_A1, CS_A2, etc.) is at or near a respective reference threshold (e.g., RT_A1, RT_A2, etc.). FIG. 3 provides additional information regarding offset error due to a sample value's proximity to a reference threshold. In some example embodiments, the circuitry 277 is configured to obtain ADC values based on applying each random noise option to the sample and obtaining a related analog value or digital value. In some example embodiments, the operations of the circuitry 277 are performed multiple times for a given sample and each random noise option. In such example embodiments, each ADC value is an average result for a given random noise option.

Figure 4:
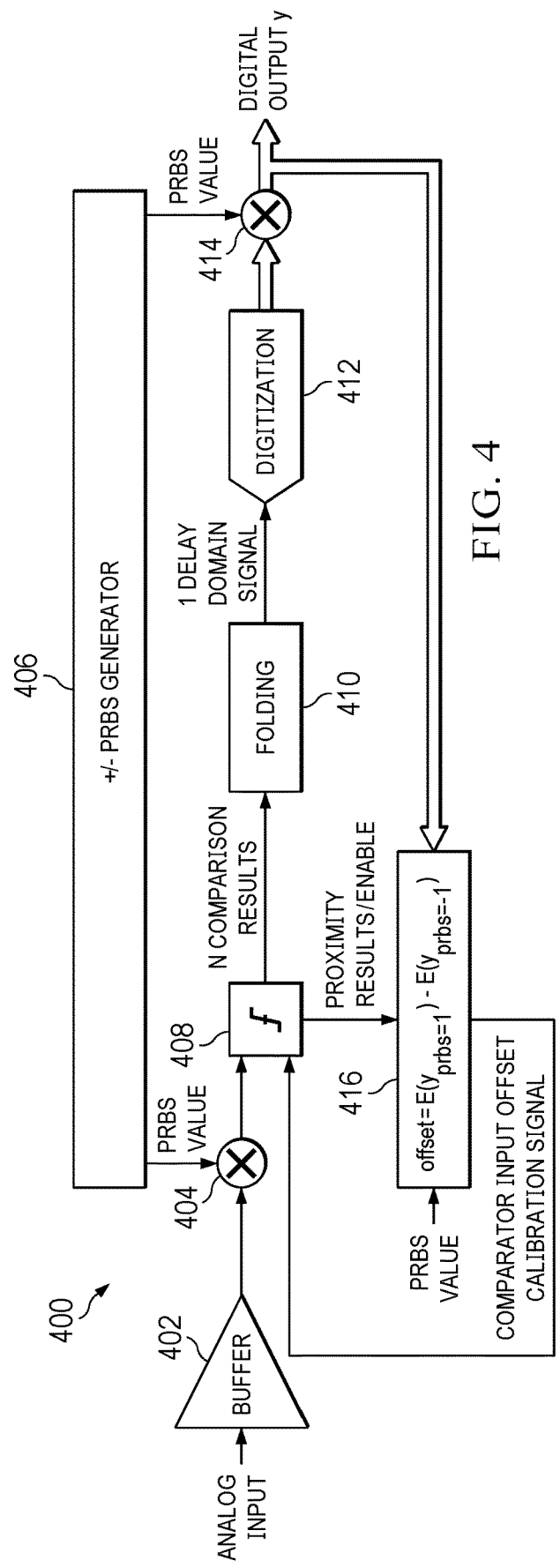
FIGS. 4-6 are block diagrams of ADC topologies in accordance with example embodiments.
Figure 5:
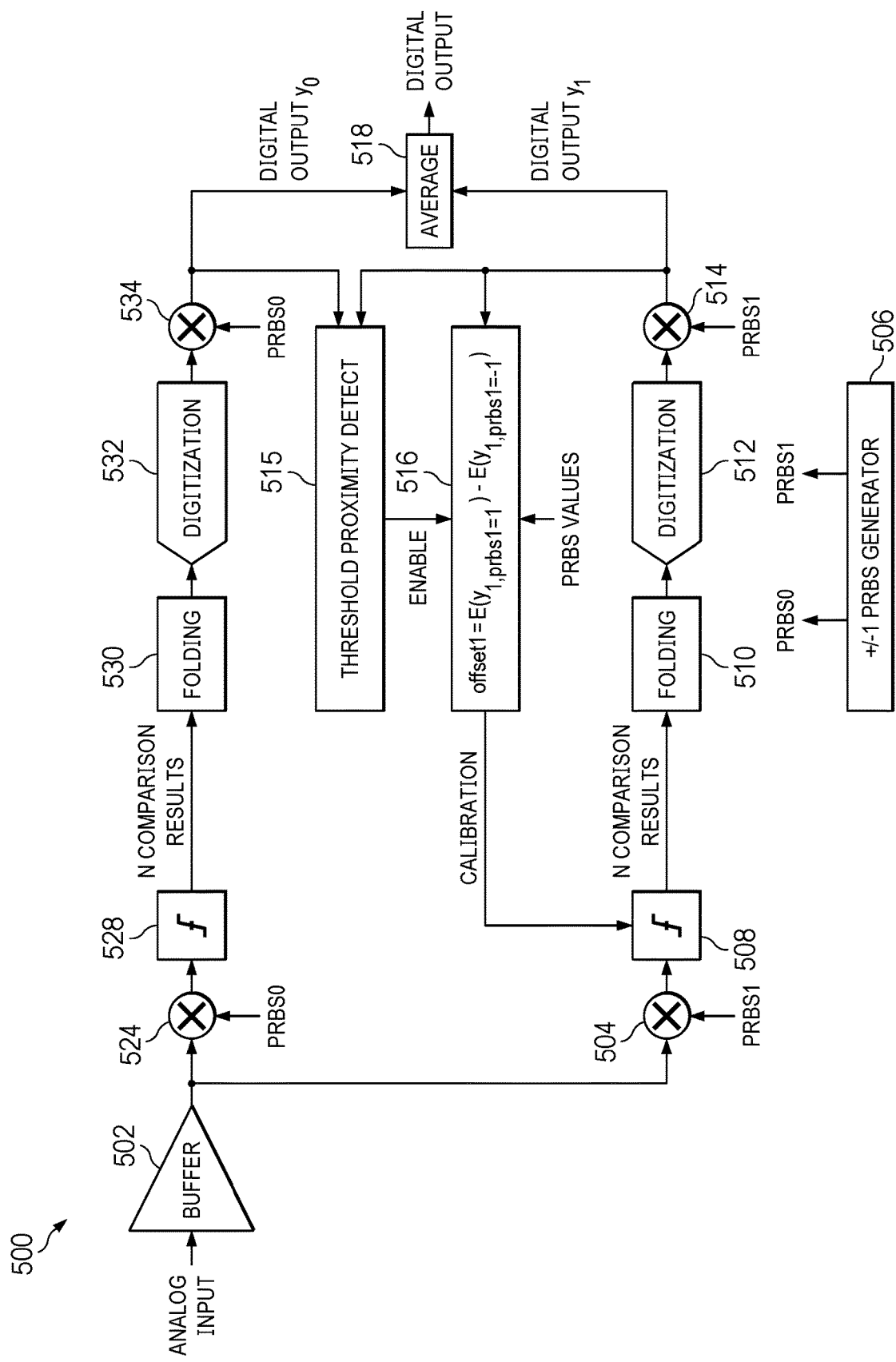
Figure 6:
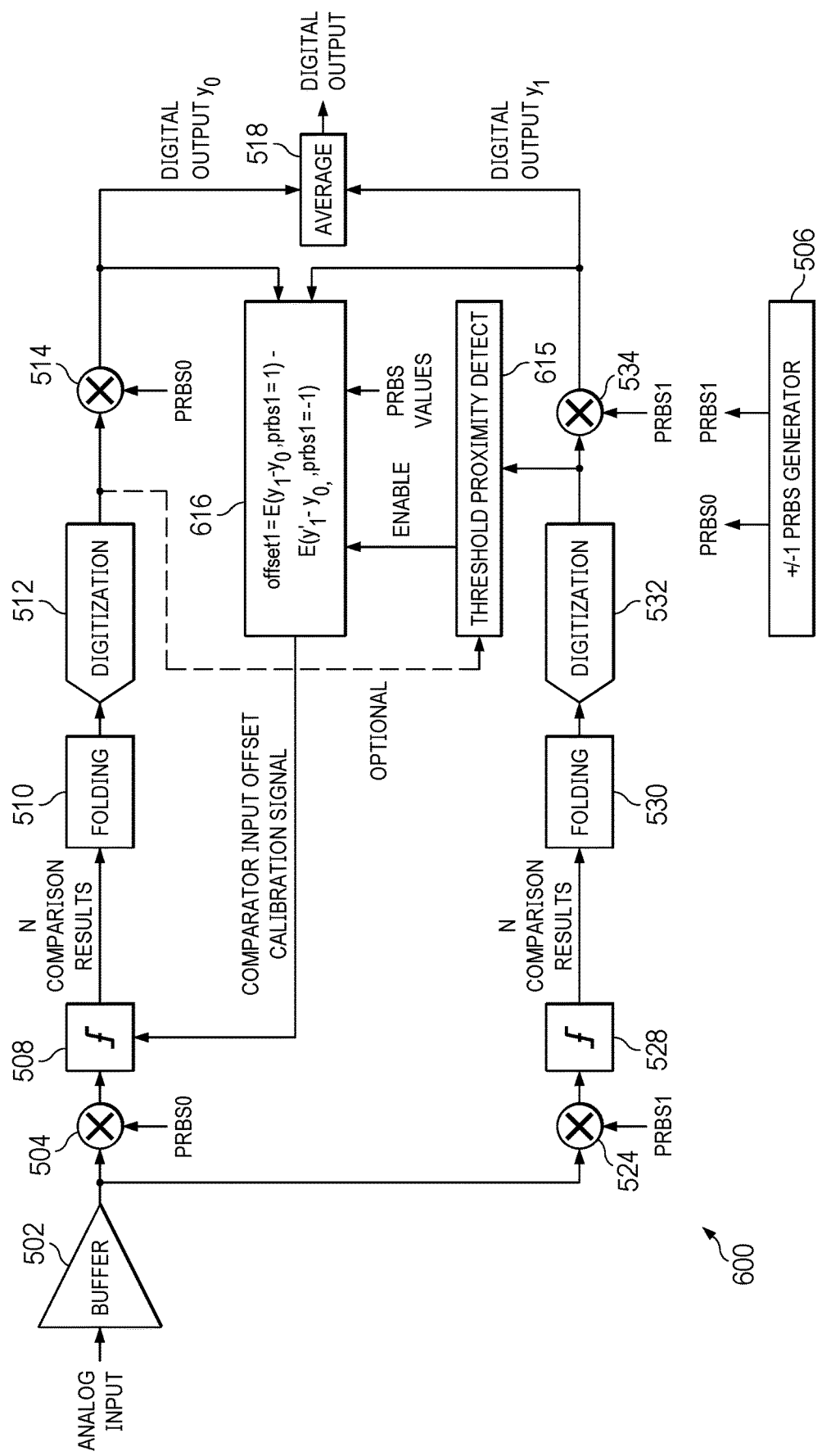

The offset error estimation circuitry 244 in stage 276 is configured to use the ADC values obtained by the circuitry 277 to estimate offset error based on the ADC samples. While it is possible to estimate the offset error from ADC values obtained using the first set of comparators 214, the number of iterations used to obtain ADC values may be reduced by obtaining ADC values using the first set of comparators 214 and the second set of comparators 272. FIGS. 4-6 describe ADC topologies 400, 500, and 600 related to these different options. Specifically, the ADC topology 400 of FIG. 4 and the ADC topology 500 of FIG. 5 obtain ADC values related to a first ADC, while the ADC topology 600 of FIG. 6 obtains ADC values related to a first ADC and a second ADC. By using ADC values related to two ADCs, the number of iterations to determine the effect of a random noise option on offset error can be reduced, which expedites offset error estimation and related comparator input offset calibration operations (if performed).

The estimated offset error determined by the offset error estimation circuitry 244 is provided to calibration estimation circuitry 252 of stage 280. If the estimated offset error is greater than an offset error threshold, the calibration estimation circuitry 252 is configured to provide a comparator input offset calibration signal. The comparator input offset calibration signal corresponds to one of more of ΔA1-ΔAN and/or ΔB1-ΔBN.

Figure 2B:
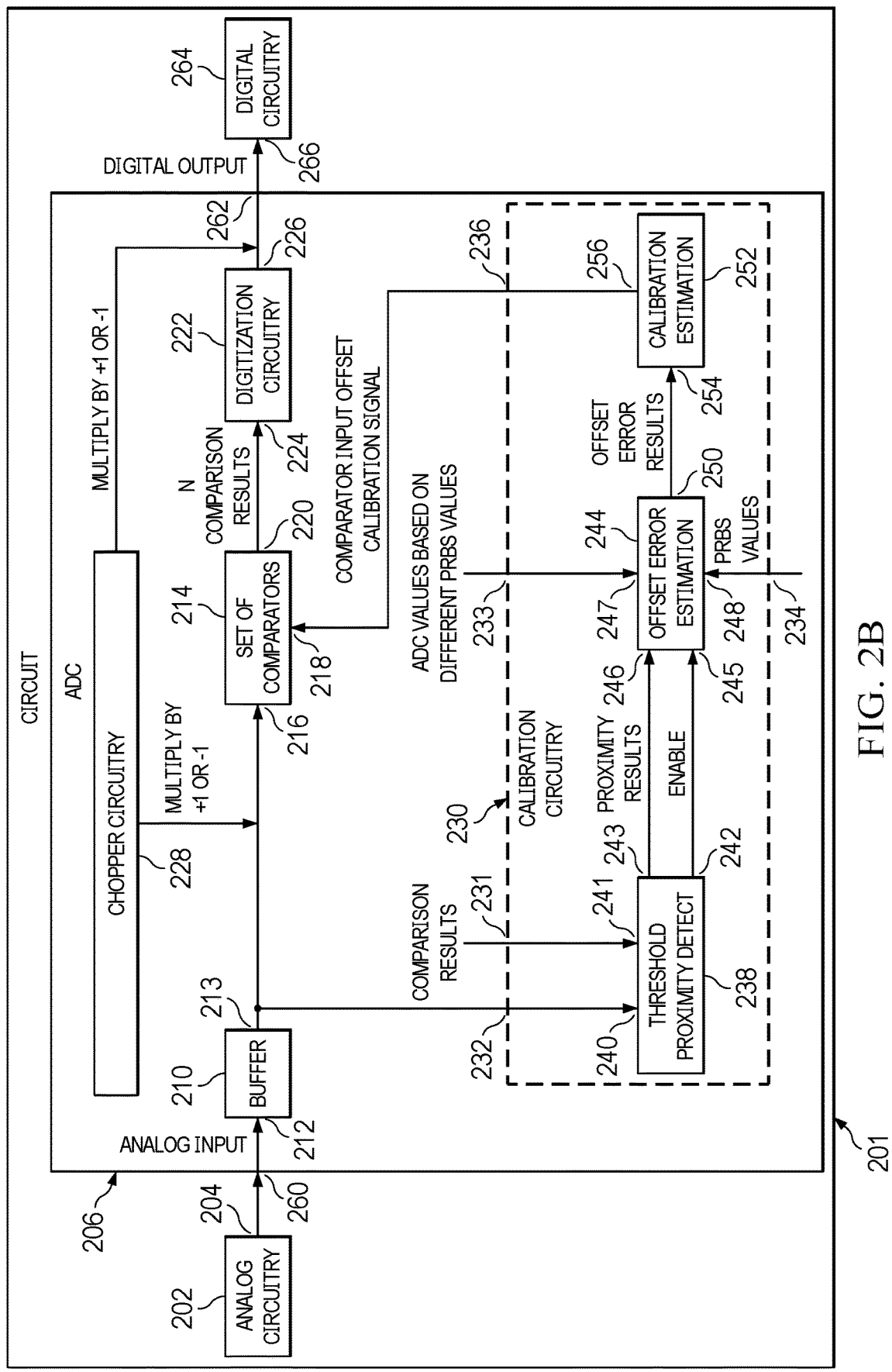
FIG. 2B is a block diagram of a circuit having an ADC in accordance with an example embodiment.

FIG. 2B is a block diagram of a circuit 201 having an analog-to-digital converter (ADC) 206 in accordance with an example embodiment. In the example of FIG. 2B, the ADC 206 includes chopper circuitry 228 as well as calibration circuitry 230. With the chopper circuitry 228, dither (random noise) values are applied (e.g., at the set of comparators input 216 and the digitization circuitry output 226) to reduce linearity error in the digital output of the ADC 206 due to comparator flicker noise of ADC comparators (e.g., the first set of comparators 214). With the calibration circuitry 230, a comparator input offset calibration or correction is selectively performed for one or more of the ADC comparators to reduce offset error as needed. The respective comparator input offset for each ADC comparator is a function of flicker noise, the chopper values applied by the chopper circuitry 228, and/or other noise sources. Rather than perform calibration of comparator input offsets all the time, the calibration circuitry 230 is configured to: selectively perform offset error estimation once of a suitable sample value has been identified; and if the estimated offset error is greater than an offset error threshold, provide a related comparator input offset correction.

Without limitation, the calibration circuitry 230 may perform the following example operations: 1) determine if an analog signal sample is proximate to an ADC comparator reference threshold, 2) if the analog signal sample is proximate to an ADC comparator reference threshold, obtain ADC values based on different pseudorandom binary sequence (PRBS) values being applied to the analog signal sample; 3) estimate an offset error based on the ADC values; and 4) provide a comparator input offset calibration signal to calibrate at least one ADC comparator if the estimated offset error is greater than an offset error threshold. When performed, comparator input offset calibration may adjust one or more comparator parameters (e.g., a positive or negative offset may be applied to the analog signal sample and/or to the respective reference threshold for a given comparator). Example circuitry for applying a positive or negative offset to the sample and/or to a respective reference threshold is an adjustable voltage source (e.g., voltage sources SA_A1, SA_AN, SA_B1 and/or SA_BN), where the control signal for the adjustable voltage source is the comparator input offset calibration signal or is adjusted by the comparator input offset calibration signal. In different example embodiment, the calibration circuitry components used to perform the operations of calibration circuitry 230 may vary. Also, in different example embodiments, the ADC values related to operations of the calibration circuitry 230 may be analog values or digital values. As another option, the ADC values related to operations of the calibration circuitry 230 may be related to one ADC or multiple ADCs. In different example embodiments, the ADC 206 may be a stand-alone integrated circuit (IC) or may be combined with the circuitry of one or more ICs.

In the example of FIG. 2B, the circuit 201 may be implemented on/in an IC, a circuit with an IC and external components (e.g., other ICs and/or discrete components) coupled via a printed circuit board (PCB), a packaged circuit with multiple ICs, a microcontroller, and/or other circuits. As shown, the circuit 201 includes the ADC 206. In some example embodiments, the ADC 206 is between analog circuitry 202 (e.g., an amplifier, one or more sensors, a filter, analog transceiver and/or other analog circuitry) and digital circuitry 264 (e.g., a processor, digital logic, digital backend to a transceiver and/or other digital circuitry) included with the circuit 201. More specifically, the ADC 206 includes an ADC input 260 and an ADC output 262. The ADC input 260 is adapted to be coupled to an analog circuitry output 204 of the analog circuitry 202. In operation, the analog circuitry 202 is configured to provide the analog input signal at the analog circuitry output 204 and the ADC 206 is configured to receive the analog input signal at the ADC input 260. Without limitation, examples of the analog circuitry 202 include sense circuitry (to sense a voltage or current in part of the circuit 201), receiver circuitry (e.g., an antenna and receiver components), and/or other analog circuits. The ADC output 262 is adapted to be coupled to a digital circuitry input 266 of the digital circuitry 264.

Figure 1:
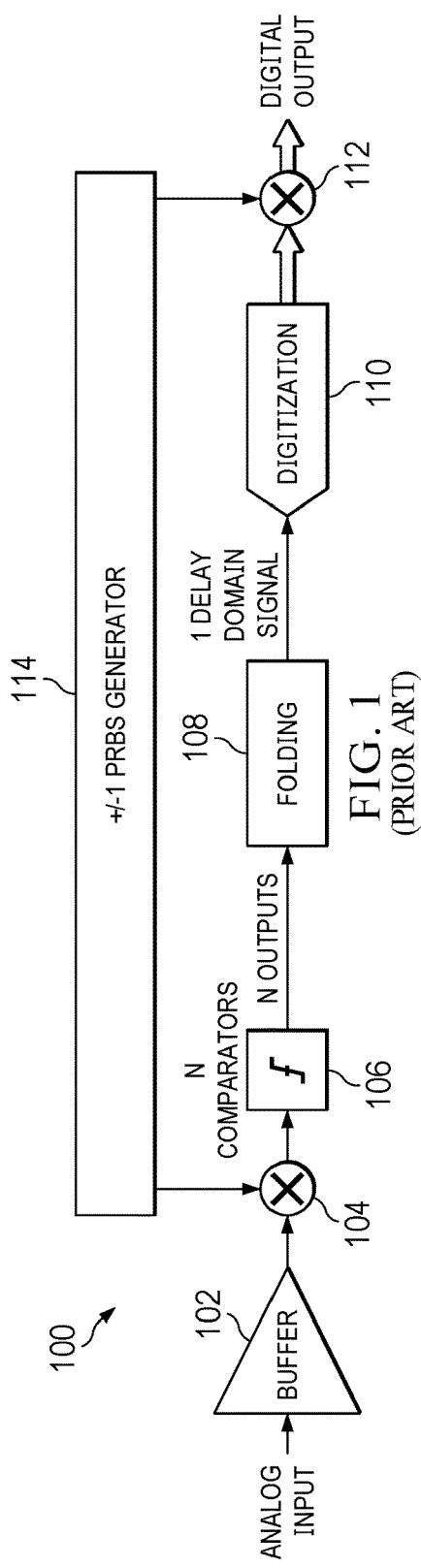
FIG. 1 is a block diagram of a delay domain analog-to-digital converter (ADC) topology having chopper circuitry in accordance with a conventional approach.

In operation, the ADC 206 is configured to provide a digital output at the ADC output 262 based the analog input signal received at the ADC input 260. The digital circuitry 264 is configured to: receive the digital output at the digital circuitry input 266; and perform operations such as storing the digital output code, analyzing the digital output code, altering the digital output code, using the digital output code to perform calculations or operations, and/or other operations. Examples of the digital circuitry 264 include a microprocessor, programmable logic, other digital circuits, and/or digital output interface circuits. With the calibration circuitry 230, the accuracy of the ADC 206 is improved relative to the conventional approach of FIG. 1 by selectively estimating and correcting for offset error attributable to flicker noise and/or the dithering operations of the chopper circuitry 228.

In some example embodiments, the ADC 206 includes a buffer circuit 210 having a buffer input 212 and a buffer output 213. The buffer input 212 is coupled to the ADC input 260. The buffer circuit 210 is configured to provide a buffered analog signal (e.g., a voltage level shift and/or current level shift relative to the analog input signal) at the buffer output 213 based on the analog input signal. As shown, the ADC 206 also includes the first set of comparators 214, the chopper circuitry 228, digitization circuitry 222, and the calibration circuitry 230.

The first set of comparators 214 has a set of comparators input 216, a set of comparators control input 218, and a set of comparators output 220. More specifically, each comparator of the first set of comparators 214 has two inputs and an output. The set of comparators input 216 is coupled to the first input of each respective comparator of the first set of comparators 214. Each second input of each respective comparator of the first set of comparators 214 is coupled to a respective reference voltage source configured to provide a reference voltage that sets the respective reference threshold for each comparator.

The set of comparators input 216 is coupled to the buffer output 213 and the chopper circuitry 228. In operation, the chopper circuitry 228 is configured to apply (e.g., via multiplication) chopper values (e.g., PRBS values such as +1 or −1) to the analog signal sample at the set of comparators input 216 and to the digital output from the digitization circuitry 222, which reduces linearity error of the ADC 206. The chopper circuitry 228 is also configured to apply different PRBS values to obtain ADC values as appropriate during operations of the calibration circuitry 230. In some example embodiments, the ADC values are obtained if the analog signal sample is proximate to one of the respective reference thresholds related to the first set of comparators 214. The ADC values are used to estimate offset error due to the comparator input offsets of one or more comparators of the first set of comparators 214. As previously noted, the calibration circuitry 230 may be configured to consider analog ADC values or digital ADC values when estimating the offset error based on the ADC values. If the estimated offset error is greater than an offset error threshold, the calibration circuitry 230 provides a comparator input offset calibration signal to the first set of comparators control input 218.

In the example of FIG. 2B, the buffered analog signal, possibly multiplied by a PRBS value, is provided to the set of comparators input 216 as an analog signal sample (sometimes just "sample" herein). The set of comparators input 216 is coupled to a respective input of each comparator of the first set of comparators 214. Each comparator of the first set of comparators 214 is configured to compare a sample obtained from the analog signal received at the set of comparators input 216 with respective reference thresholds (e.g., a respective reference voltage for each comparator of the first set of comparators 214). In operation, the first set of comparators 214 is configured to provide N (e.g., where N is an integer value that is equal to 1 or greater and may represent the number of comparators in comparator circuitry 214) comparison results at the first set of comparators output 220 based on the sample obtained from the analog signal received at the set of comparators input 216 and the respective reference thresholds. When calibration is performed, the first set of comparators 214 is configured to receive (e.g., from calibration estimation circuitry 252) the comparator input offset calibration signal at the set of comparators control input 218. In response to receiving the comparator input offset calibration signal at the set of comparators control input 218, the first set of comparators 214 is configured to provide a comparator input offset correction by adjusting one or more comparator parameters (e.g., a positive or negative offset may be applied to the analog signal sample and/or to the respective reference threshold for a given comparator). Example circuitry for applying a positive or negative offset to the sample and/or to a respective reference threshold is an adjustable voltage source, where the control signal for the adjustable voltage source is the comparator input offset calibration signal or is adjusted by the comparator input offset calibration signal. In some example embodiments, the comparator input offset calibration signal is provided by the calibration circuitry 230 in response to: 1) the sample being detected as proximate to one of the respective reference thresholds; and 2) an estimated offset error (based on ADC values resulting from the application of different PRBS values) being greater than an offset error threshold.

As shown, the digitization circuitry 222 includes a digitization circuitry input 224 and a digitization circuitry output 226. The digitization circuitry input 224 is coupled to the set of comparators output 220. In operation, the digitization circuitry 222 is configured to: receive the N comparison results at the digitization circuitry input 224; and provide a digital output code at the digitization circuitry output 226 based on the N comparison results and a mapping. In some example embodiments, the mapping is a delay domain mapping. In such embodiments, the digitization circuitry 222 may include folding circuitry configured to convert the N comparison results received at the digitization circuitry input 224 to a delay domain signal. The delay domain signal is then converted to a digital code, which is provided to the digitization circuitry output 226 as the digital output code. In other example embodiments, the mapping is a folding interpolation mapping. In such embodiments, the digitization circuitry 222 may include folding circuitry configured to convert the N comparison results received at the digitization circuitry input 224 to a folding interpolation signal. The folding interpolation signal is then converted to a digital code, which is provided to the digitization circuitry output 226 as the digital output code. As shown, the digitization circuitry output 226 is coupled to the chopper circuitry 228 and the ADC output 262. The chopper circuitry 228 is configured to apply chopper values to the digital output code (e.g., by multiplying the digital output code by a PRBS value such as +1 or −1).

With the dithering operations of the chopper circuitry 228, linearity error in the digital output code of the ADC 206 due to flicker noise of ADC comparators (e.g., the first set of comparators 214) is reduced. However, the dithering operations of the chopper circuitry 228 can increase comparator input offset and related offset error in the ADC output. To account for such offset error (e.g., the average error due to a comparator's input offset), the calibration circuitry 230 may perform the following example operations: 1) determine if the sample input to the first set of comparators 214 is proximate to (e.g., equal to, approximately equal to or having a value that is the closest to) any of the respective reference thresholds; 2) if the sample is proximate to one of the respective reference thresholds, obtain ADC values based on different PRBS values being applied to the sample; 3) estimate an offset error based on the ADC values; and 4) provide the comparator input offset calibration signal to calibrate at least one comparator of the first set of comparators 214 if the estimated offset error is greater than an offset error threshold. When the comparator input offset calibration signal is provided to the set of comparators control input 218, the first set of comparators 214 is configured to provide an offset error correction by adjusting one or more comparator parameters (e.g., a positive or negative offset may be applied to the analog signal sample and/or to the respective reference threshold for a given comparator). Example circuitry for applying a positive or negative offset to the sample and/or to a respective reference threshold is an adjustable voltage source, where the control signal for the adjustable voltage source is the comparator input offset calibration signal or is adjusted by the comparator input offset calibration signal. In different example embodiments, operations of the calibration circuitry 230 may be performed as an initial calibration, a scheduled calibration, a periodic calibration, and/or a trigger-based calibration.

In the example of FIG. 2B, the calibration circuitry 230 includes a first calibration circuitry input 231, a second calibration circuitry input 232, a third calibration circuitry input 233, a fourth calibration circuitry input 234, and a calibration circuitry output 236. The first calibration circuitry input 231 is coupled to the set of comparators output 220 and receives the comparison results from the set of comparators output 220. The second calibration circuitry input 232 is coupled to the set of comparators input 216 and receives the sample. The third calibration circuitry input 233 receives ADC values based on different PRBS values once offset error estimation is initiated. In some example embodiments, the third calibration circuitry input 233 is coupled to the digitization circuitry output 226 and receives digital output values based on different PRBS values as the ADC values. In other example embodiments, the third calibration circuitry input 233 is coupled to the set of comparators output 220 and receives analog comparison results based on different PRBS values as the ADC values. The fourth calibration circuitry input 234 is coupled to the chopper circuitry 228 and is configured to receive PRBS values from the chopper circuitry 228.

As shown, the calibration circuitry 230 includes threshold proximity detect circuitry 238, offset error estimation circuitry 244, and calibration estimation circuitry 252. The threshold proximity detect circuitry 238 includes a first threshold proximity detect circuitry input 240, a second threshold proximity detect circuitry input 241, a first threshold proximity detect circuitry output 242, and a second threshold proximity detect circuitry output 243. The first threshold proximity detect circuitry input 240 is coupled to the second calibration circuitry input 232 and receives the sample. The second threshold proximity detect circuitry input 241 is coupled to the first calibration circuitry input 231 and receives the comparison results provided from the set of comparators output 220 to the first calibration circuitry input 231. In operation, the threshold proximity detect circuitry 238 is configured to detect whether the sample is proximate to one of the respective reference thresholds related to the first set of comparators 214 based on the sample and the comparison results.

In some example embodiments, the threshold proximity detect circuitry 238 includes a second set of comparators coupled to the first threshold proximity detect circuitry input 240. As an option, the second set of comparators may be part of a second ADC (e.g., the second ADC may include the second set of comparators, e.g., comparators 272 of FIG. 2A, and digitization circuitry, e.g., digitization circuitry 275 of FIG. 2A) included with or coupled to the calibration circuitry 230. The second set of comparators is configured to compare the sample with its own respective reference thresholds and provide comparison results. If the comparison results from the second set of comparators differs from the comparison results from the first set of comparators 214, the threshold proximity detect circuitry 238 interprets the difference as a detection that the sample is proximate to one of the respective reference thresholds of the first set of comparators 214. In response, the threshold proximity detect circuitry 238 (e.g., through circuitry similar to circuit 273 of FIG. 2A) is configured to assert an enable signal at the first threshold proximity detect circuitry output 242. In some example embodiments, the threshold proximity detect circuitry 238 may also provide proximity results (e.g., the comparison results of the first and/or second sets of comparators) at the second threshold proximity detect circuitry output 243.

In FIG. 2B, the offset error estimation circuitry 244 includes a first offset error estimation circuitry input 245, a second offset error estimation circuitry input 246, a third offset error estimation circuitry input 247, a fourth offset error estimation circuitry input 248, and an offset error estimation circuitry output 250. The first offset error estimation circuitry input 245 is coupled to the first threshold proximity detect circuitry output 242 and receives the enable signal when asserted by the threshold proximity detect circuitry 238. The second offset error estimation circuitry input 246 is coupled to the second threshold proximity detect circuitry output 243 and receives proximity results when provided by the threshold proximity detect circuitry 238. The third offset error estimation circuitry input 247 is coupled to the set of comparators output 220 or the ADC output 262 and receives ADC values based on different PRBS values (e.g., +1 and −1) after offset error estimation operations are initiated (e.g., in response to the threshold proximity detect circuitry 238 providing the enable signal upon detecting that the sample is proximate to a respective reference threshold related to the first set of comparators 214). The fourth offset error estimation circuitry input 248 is coupled to the chopper circuitry 228 and receives PRBS values (e.g., +1 or −1) when provided by the chopper circuitry 228.

In some example embodiments, the offset error estimation circuitry 244 includes a processor, digital logic, memory, other programmable circuitry and/or software configured to estimate offset error based on available ADC values. The ADC values received at the third offset error estimation circuitry input 247 (via the third calibration circuitry input 233) are related to comparison results of the first set of comparators 214 and are sometimes referred to herein as a first set of ADC values. In some example embodiments, the offset error estimation circuitry 244 is configured to obtain ADC values related to comparison results of the second set of comparators (e.g., part of the threshold proximity detect circuitry 238). The ADC values related to comparison results of the second set of comparators are sometimes referred to herein as a second set of ADC values. In different example embodiments, the offset error estimation circuitry 244 may receive the second set of ADC values from the output of the second set of comparators or from the output of digitization circuitry coupled to the output of the second set of comparators (e.g., the second set of ADC values may be analog values or digital values). In either case, the second set of ADC values is based on different PRBS values being applied to the sample provided to the second set of comparators (the same sample is provided to the first set of comparators 214). The offset error estimation circuitry 244 is configured to estimate the offset error based on available ADC values. In some example embodiments, the offset error is estimated based on the first and second sets of ADC values. As an option, offset error estimation involves: averaging the first set of ADC values to obtain a first average value; averaging the second set of ADC values to obtain a second average value; and estimating the offset error based on the first and second average values.

In some example embodiments, the offset error estimation circuitry 244 is configured to perform offset error estimation in response to: the enable signal received at the first offset error estimation circuitry input 245; proximity results (comparison results of the first set of comparators 214 and/or comparison results of the second set of comparators) received at the second offset error estimation circuitry input 246; ADC values received at the third offset error estimation circuitry input 247, ADC values obtained by the offset error estimation circuitry 244 (e.g., based on the proximity results or related comparison results from the second set of comparators), and/or PRBS values received at the fourth offset error estimation circuitry input 248. In some example embodiments, the offset error estimation circuit 244 is configured to estimate the offset error as:

$$\text{offset error} = E(y_{prbs=1}) - E(y_{prbs=-1}),  \quad (1)$$

where $E(y_{prbs=1})$ is the expectation or mean in the digital output code of the ADC 206 for samples when the PRBS value=1, and $E(y_{prbs=-1})$ is the expectation or mean in the digital output code of the ADC 206 for samples when the PRBS value=−1. In some example embodiments, the expectation or mean in the digital output code is determined by integrating the effect of applying a given PRBS value to samples over time. When offset error estimation is performed, the offset error estimation circuit 244 is configured to provide offset error results to the offset error estimation circuitry output 250.

In some example embodiments, the ADC 206 is a first ADC and the calibration circuitry 230 includes a second ADC having a second set of comparators (a set of threshold proximity detect comparators) configured to detect whether the sample is proximate to one of the respective reference thresholds related to the first set of comparators 214. In such example embodiments, an averaging circuit may average the digital output codes of the first and second ADCs to provide an averaged digital output code from the ADC output 262.

When a first ADC and a second ADC are used, the offset error estimation circuit 244 may be configured to estimate the offset error as:

$$\text{offset error} = E(y_{1,prbs=1}) - E(y_{1,prbs=-1}),  \quad (2)$$

where $E(y_{1,prbs=1})$ is the expectation or mean in the digital output code of the first ADC for samples when PRBS value=1, and $E(y_{1,prbs=-1})$ is the expectation or mean in the digital output code of the first ADC for samples when PRBS value=−1. As another option, the offset error estimation circuit 244 may be configured to estimate the offset error as:

$$\text{offset error} = E(y_1 - y_0, prbs=1) - E(y_1 - y_0 prbs=-1),  \quad (3)$$

where $E(y_1-y_0, prbs=1)$ is the expectation or mean in the digital output code of the first ADC minus a digital output code of the second ADC for samples when the PRBS value=1, and $E(y_1-y_0, prbs=-1)$ is the expectation or mean in the digital output code of the first ADC minus the digital output code of the second ADC for samples when the PRBS value=−1. In some example embodiments, the expectation or mean in the digital output code of a given ADC is determined by integrating the effect of applying a given PRBS value to samples over time.

In FIG. 2B, the calibration estimation circuitry 252 includes a calibration estimation circuitry input 254 and a calibration estimation circuitry output 256. The calibration estimation circuitry 252 is configured to provide a comparator input offset calibration signal at the calibration estimation circuitry output 256 based on the offset error results received at the calibration estimation circuitry input 254. For example, if the offset error results indicate the offset error is greater than an offset error threshold, the calibration estimation circuitry 252 is configured to provide the comparator input offset calibration signal at the calibration estimation circuitry output 256 to correct for the offset error. As an option, the offset error results may include a total estimated offset error (in addition to or instead of an indication that the offset error is greater than the offset error threshold). In either case, the calibration estimation circuitry 252 is configured to provide a comparator input offset calibration signal based on the offset error results, where the comparator input offset calibration signal is used to adjust one or more comparator parameters (e.g., a positive or negative offset may be applied to the analog signal sample and/or to the respective reference threshold for a given comparator). Example circuitry for applying a positive or negative offset to the sample and/or to a respective reference threshold is an adjustable voltage source, where the control signal for the adjustable voltage source is the comparator input offset calibration signal or is adjusted by the comparator input offset calibration signal.

FIG. 3 is a graph 300 showing offset error as a function of sample value and chopper value (e.g., the dither value or PRBS value) in accordance with example embodiments. In the example of graph 300, the sample value may vary in magnitude. In graph 300, various comparator reference thresholds (e.g., threshold$_{-2}$, threshold$_{-1}$, threshold$_{0}$, threshold$_{1}$, threshold$_{2}$) are represented along the sample axis (the x-axis). As samples are obtained, each sample value may or may not be near a particular comparator reference. In the example of FIG. 3, applying a chopper value of 1 results in a peak positive offset error 302A (relative to a default ADC output error 308, which may be assumed to be based on a target accuracy criteria) when the sample value is at threshold$_{-1}$. Alternatively, applying a chopper value of −1 may result in a peak negative offset error 302B (relative to the default ADC output error 308). In other example embodiments, the particular comparator reference threshold at which there is a peak offset error 302A and/or a peak positive offset error 302B varies. In the example of FIG. 3, the magnitude of the positive and negative offset error due to applying chopper values of +1 and −1 to a sample are aligned. In some example embodiments, this alignment is based on application of chopper values to both the analog input as well as each comparator reference voltage. As shown, the magnitude of the positive and negative offset error may be minimal at other reference thresholds (e.g., $threshold_{-2}$, $threshold_0$, $threshold_1$, $threshold_2$). In different example embodiments, multiple thresholds or each threshold may correspond to a peak offset error (positive or negative).

In the example of FIG. 3, there is a range of samples within the dashed lines 304A and 304B that would be considered proximate to the threshold–1 (e.g., within 20% of the $threshold_{-1}$). By adjusting this range of proximate samples, it is possible to reduce or expand offset error estimation and related correction operations. In some example embodiments, the calibration circuitry 230 includes an input or user interface that enables the range of proximity to be reduced or expanded. When moving further away from $threshold_{-1}$, there is a positive offset error 306A that relates to the boundary of sample values proximate to $threshold_{-1}$ or a related offset error threshold. Any less proximate sample value or related offset error can be ignored. Similarly, when moving further away from $threshold_{-1}$, there is a negative offset error 306B that relates to the boundary of sample values proximate to $threshold_{-1}$ or a related offset error threshold. Again, any less proximate sample value or related offset error can be ignored. Of course, it is possible to adjust the proximity range and/or the offset error threshold as desired for a given ADC or use scenario. In different example embodiments, the difference between the dashed line 306A and the default ADC output error 308 may correspond to an offset error resulting in a least significant bit (LSB) change or a binary-coded decimal (BCD) change in the digital output code provided by an ADC (e.g., the ADC 206) for a sample proximate to a given comparator reference threshold.

FIGS. 4-6 are block diagrams of ADC topologies 400, 500, and 600 in accordance with example embodiments. In FIG. 4, the ADC topology 400 includes a buffer circuit 402 (an example of the buffer circuit 210 in FIG. 2B) configured to: receive an analog input signal; and provide a buffered signal based on the analog input signal. The ADC topology 400 also includes a first multiplier 404 having: a first input coupled to an output of the buffer circuit 402 to receive the buffered from the output of the buffer circuit 402; and a second input coupled to a +/−1 PRBS generator 406 to receive a PRBS value from the +/−1 PRBS generator 406. In FIG. 4, the +/−1 PRBS generator 406, the first multiplier 404 and a second multiplier 414 are components of chopper circuitry (e.g., the chopper circuitry 228 in FIGS. 2A and 2B) for the ADC topology 400. As shown, the output of the multiplier 404 is coupled to compare circuitry 408 that includes a set of comparators (e.g., the first set of comparators 214 in FIGS. 2A and 2B) and threshold proximity detect circuitry (e.g., some or all of the threshold proximity detect circuitry 238 of FIG. 2B). In some example embodiments, the compare circuitry 408 includes a first set of comparators and a second set of comparators (e.g., the second set of comparators 272 in FIG. 2A).

In the example of FIG. 4, the compare circuitry 408 provides N comparison results (from the first set of comparators) to folding circuitry 410, where the N comparison results are based on a sample (from the output of the multiplier 404) and respective reference thresholds of the first set of comparators. The compare circuitry 408 also detects whether the sample is proximate to one of the respective reference thresholds of the first set of comparators (e.g., by comparing the comparison results from the first set of comparators with comparison results of the second set of comparators). If the comparison results of the first and second sets of comparators differ, the compare circuitry 408 is configured to assert an enable signal to a calibration control circuit 416 (e.g., a combination of the offset error estimation circuit 244 and the calibration estimation circuit 252 in FIGS. 2A and 2B). The compare circuitry 408 may also provide proximity results (e.g., the comparison results from the first set of comparators and/or the second set of comparators) for use in obtaining ADC values used for offset error estimation. Together, the calibration control circuit 416 and some of the compare circuit 408 are an example of the calibration circuitry 230 of FIG. 2B.

In FIG. 4, the folding circuit 410 is configured to perform a mapping to convert the N comparison results (output from compare circuit 408) to a delay domain signal. In other example embodiments, the folding circuit 410 is configured to perform a mapping to convert the N comparison results to a folding interpolation signal. In FIG. 4, the delay domain signal is provided to digitization circuitry 412, which converts the delay domain signal to a digital output code. The digital output code is provided to the multiplier 414, which multiplies the digital output code by a PRBS value received from the +/−1 PRBS generator 406. The output from the multiplier 414 is a digital output y. In the example of FIG. 4, the digital output y is provided as an ADC value to the calibration control circuit 416. The calibration control circuit 416 may also receive an indication of the PRBS value related to the received ADC value. In response to receiving the enable signal from the compare circuitry 408, the calibration control circuit 416 is configured to perform offset error estimation operations.

In some example embodiments, the offset error is estimated by the calibration control circuit 416 as:

$$\text{offset error} = E(y_{prbs=1}) - E(y_{prbs=-1}), \quad (4)$$

where $E(y_{prbs=1})$ is the expectation or mean in the digital output code of the ADC topology 400 for samples with the PRBS value is 1, and $E(y_{prbs=-1})$ is expectation or mean in the digital output code of the ADC topology 400 for samples with the PRBS value is −1. In some example embodiments, the expectation or mean in the digital output code of the ADC topology 400 is determined by integrating the effect of applying a given PRBS value to samples over time. If the estimated offset error is greater than an offset error threshold, the calibration control circuit 416 performs a comparator input offset calibration based on a scaled and accumulated version of the offset error due to each comparator input offset being calibrated. In some example embodiments, the offset error threshold is design parameter based on a target performance for a given ADC topology. In some example embodiments, an offset error threshold may range from 20 uV to 120 uV depending on the ADC topology. Without limitation, the offset error threshold is selected and related calibration operations are performed to ensure offset error results in less than a 1 LSB shift in ADC output accuracy. When performed, comparator input offset calibration or correction may adjust one or more comparator parameters (e.g., a positive or negative offset may be applied to the sample and/or to the respective reference threshold for a given comparator). Example circuitry for applying a positive or negative offset to the sample and/or to a respective reference threshold is an adjustable voltage source (e.g., as illustrated in FIG. 2A), where the control signal for the adjustable voltage source is the comparator input offset calibration signal or is adjusted by the comparator input offset calibration signal.

With the offset error estimation and comparator input offset calibration operations, error in the digital output y of the ADC topology 400 due to offset error (e.g., error due to a comparator's input offset, which is a function of flicker noise, dither noise, and/or other noise sources) is reduced. In some example embodiments, calibration of comparator input offsets for the ADC topology 400 is performed in the background periodically (e.g., based on a timer or counter). In other embodiments, calibration of comparator input offsets for the ADC topology 400 is performed as an initial calibration to start ADC operations with corrected input offsets. In some example embodiments, offset error estimation and related comparator input offset calibration operations may be performed in combination with linearity error calibration (a calibration to determine an inverse mapping to address nonlinearity) as well as linearity error correction (the application of chopper values).

In FIG. 5, the ADC topology 500 includes a first ADC (including a first set of comparators 508, first folding circuitry 510, and first digitization circuitry 512) and a second ADC (including a second set of comparators 528, second folding circuitry 530, and second digitization circuitry 532) in parallel with the first ADC. With the ADC topology 500, the second ADC may be considered to be part of the calibration circuitry (e.g., the calibration circuitry 230 in FIG. 2B) for comparators of the first ADC.

As shown, the ADC topology 500 also includes a buffer circuit 502 (an example of the buffer circuit 210 in FIG. 2B) configured to receive an analog input signal and provide a buffered signal based on the analog input signal. The ADC topology 500 also includes a first multiplier 504 having: a first input coupled to an output of the buffer circuit 502 and configured to receive the buffered signal; and a second input coupled to a +/−1 PRBS generator 506 and configured to receive a PRBS value (PRBS1) from the +/−1 PRBS generator 506. In FIG. 5, the +/−1 PRBS generator 506, the first multiplier 504 and a second multiplier 514 are components of chopper circuitry (e.g., the chopper circuitry 228 in FIGS. 2A and 2B) for the first ADC of the ADC topology 500.

As shown, the output of the first multiplier 504 is coupled to an input of the first set of comparators 508 (an example of the first set of comparators 214 in FIGS. 2A and 2B). The first set of comparators 508 is configured to obtain a sample of the signal at its input (the output of the first multiplier 504) and provide N comparison results to the first folding circuit 510, where the N comparison results are based on the sample and respective reference thresholds of the first set of comparators 508. In FIG. 5, the first folding circuitry 510 is configured to perform a mapping to convert the N comparison results to a delay domain signal. In other example embodiments, the first folding circuit 510 is configured to perform a mapping to convert the N comparison results to a folding interpolation signal. In FIG. 5, the delay domain signal from the first folding circuit 510 is provided to the first digitization circuitry 512, which converts the delay domain signal to a digital output code. The first digitization circuitry 512 provides the digital output code to the second multiplier 514, which multiplies the digital output code by a PRBS value (PRBS1) received from the +/−1 PRBS generator 506. The output from the second multiplier 514 is a digital output $y_1$ for the first ADC of the ADC topology 500.

In the example of FIG. 5, the ADC topology 500 also includes a third multiplier 524 having: a first input coupled to the output of the buffer circuit 502 to receive the buffered signal from the buffer circuit 502; and a second input coupled to the +/−1 PRBS generator 506 to receive a PRBS value (PRBS0) from the +/−1 PRBS generator 506. In FIG. 5, the +/−1 PRBS generator 506, the third multiplier 524 and a fourth multiplier 534 are components of chopper circuitry (e.g., the chopper circuitry 228 in FIGS. 2A and 2B) for the second ADC of the ADC topology 500. With the ADC topology 500 of FIG. 5, there is no intended correlation between PRBS0 and PRBS1 because random values are used. Also, it should be noted that the same value of PRBS0 will be applied at two locations of the ADC topology 500 (before and after the second ADC) in a manner that is aligned with each given sample as it passes through the second ADC path. Similarly, the same value of PRBS1 will be applied at two locations of the ADC topology 500 (before and after the first ADC) in a manner that is aligned with each given sample as it passes through the first ADC path.

As shown, the output of the third multiplier 524 is coupled to the second set of comparators 528 (an example of threshold proximity detect components of the threshold proximity detect circuitry 238 in FIG. 2B). The second set of comparators 528 provide N comparison results to the second folding circuitry 530. In FIG. 5, the second folding circuitry 530 is configured to perform a mapping to convert the N comparison results to a delay domain signal. In other example embodiments, the second folding circuitry 530 is configured to perform a mapping to convert the N comparison results to a folding interpolation signal. In FIG. 5, the delay domain signal from the second folding circuitry 530 is provided to the second digitization circuitry 532, which converts the delay domain signal to a digital output code. The second digitization circuitry 532 provides the digital output code to the fourth multiplier 534, which multiplies the digital output code by a PRBS value (PRBS0) received from the +/−1 PRBS generator 506. The output from the multiplier 534 is a digital output $y_0$ for the second ADC of the ADC topology 500.

In some example embodiments, the ADC topology 500 includes an averaging circuit 518 coupled to the output of the second multiplier 514 and the output of the fourth multiplier 534. The output of the averaging circuit 518 is the digital output of the ADC topology 500. With the averaging circuit 518, the noise level of the overall output of the ADC topology 500 is improved. Without such averaging, the signal-to-noise ratio (SNR) of the ADC topology 500 is reduced by approximately 3 dB. Without limitation, averaging may improve ADC SNR from 55 dB (e.g., the SNR of an individual ADC) to 58 dB (e.g., the SNR of two ADCs with averaged outputs). In the example of FIG. 5, the outputs of the second multiplier 514 and the fourth multiplier 534 are provided to threshold proximity detect circuitry 515 (an example of part of the threshold proximity detect circuitry 238 in FIG. 2B). In some example embodiments, the threshold proximity detect circuitry 515 detects whether a sample is proximate to one of the respective reference thresholds of the first set of comparators 508 by comparing output of the second multiplier 514 with the output of the fourth multiplier 534. If the outputs of the second multiplier 514 and the fourth multiplier 534 differ, the threshold proximity detect circuitry 515 asserts an enable signal to a calibration control circuit 516 (e.g., a combination of the offset error estimation circuit 244 and the calibration estimation circuit 252 in FIGS. 2A and 2B). In other example embodiments, the comparison results of the first set of comparators 508 and the second set of comparators 528 could be provided to the threshold proximity detect circuitry 515 (e.g., as in FIG. 4)

for threshold proximity detection. Besides the enable signal, the calibration control circuit 516 also receives the digital outputs $y_0$ and $y_1$ and related PRBS values. Together, the calibration control circuitry 516, the threshold proximity detect circuitry 515, and components of the second ADC in the ADC topology 500 are an example of the calibration circuitry 230 of FIG. 2B.

In response to receiving the enable signal from the threshold proximity detect circuitry 515, the calibration control circuit 516 is configured to perform offset error estimation based on ADC values obtained from the comparison results of the first set of comparators 508. If the estimated offset error is greater than an offset error threshold, the calibration control circuit 516 is also configured to: perform comparator input offset calibration operations; and provide related calibration signals as appropriate. In some example embodiments, the offset error is estimated by the calibration control circuit 516 using equation (4), above. In some example embodiments, the expectation or mean in the digital output code of the first ADC of the ADC topology 500 is determined by integrating the effect of applying a given PRBS value to samples over time. If the estimated offset error is greater than an offset error threshold, comparator input offset calibration is performed. In some example embodiments, comparator input offset calibration may be based on a scaled and accumulated version of the offset error estimate attributable to each comparator being calibrated. When performed, a comparator input offset calibration or correction may adjust one or more comparator parameters (e.g., a positive or negative offset may be applied to the analog signal sample and/or to the respective reference threshold for a given comparator). Example circuitry for applying a positive or negative offset to the sample and/or to a respective reference threshold is an adjustable voltage source, where the control signal for the adjustable voltage source is the comparator input offset calibration signal or is adjusted by the comparator input offset calibration signal.

In some example embodiments, calibration of comparator input offsets for the ADC topology 500 is performed in the background periodically (e.g., based on a timer or counter). As another option, calibration of one or more comparator input offsets to account for comparator offset error of the ADC topology 500 is performed as an initial calibration to start ADC operations with corrected comparator input offsets. In some example embodiments, offset error estimation and related comparator input offset calibration operations may be performed in combination with linearity error calibration (a calibration to determine an inverse mapping to address nonlinearity) as well as linearity error correction (the application of chopper values).

In FIG. 6, the ADC topology 600 includes a first ADC (including the first set of comparators 508, the first folding circuitry 510, and the first digitization circuitry 512) and a second ADC (including the second set of comparators 528, the second folding circuitry 530, and the second digitization circuitry 532) in parallel with the first ADC. With the ADC topology 600, the second ADC is included with or coupled to calibration circuitry (e.g., the calibration circuitry 230 in FIG. 2B) for comparators of the first ADC.

As shown, the ADC topology 600 also includes the buffer circuit 502 (an example of the buffer circuit 210 in FIG. 2B) configured to receive an analog input signal and provide a buffered signal based on the analog input signal. The ADC topology 600 also includes the first multiplier 504 having: a first input coupled to an output of the buffer circuit 502 and configured to receive the buffered signal; and a second input coupled to the +/−1 PRBS generator 506 and configured to receive a PRBS value (PRBS0) from the +/−1 PRBS generator 506. In FIG. 6, the +/−1 PRBS generator 506, the first multiplier 504 and the second multiplier 514 are components of chopper circuitry (e.g., the chopper circuitry 228 in FIGS. 2A and 2B) for the first ADC of the ADC topology 600. As shown, the output of the first multiplier 504 is coupled to the first set of comparators 508 (an example of the first set of comparators 214 in FIGS. 2A and 2B). The first set of comparators 508 are configured to provide N comparison results to the first folding circuit 510 based on a sampled input (from the output of the first multiplier 504) and respective reference thresholds.

In FIG. 6, the first folding circuitry 510 is configured to perform a mapping to convert the N comparison results from the first set of comparators 508 to a delay domain signal. In other example embodiments, the first folding circuit 510 is configured to perform a mapping to convert the N comparison results from the first set of comparators 508 to a folding interpolation signal. In FIG. 6, the delay domain signal from the first folding circuit 510 is provided to the first digitization circuitry 512, which converts the delay domain signal to a digital output code. The first digitization circuitry 512 provides the digital output code to the second multiplier 514, which multiplies the digital output code by a PRBS value (PRBS0) received from the +/−1 PRBS generator 506. The output from the second multiplier 514 is a digital output $y_0$ for the first ADC of the ADC topology 600.

The ADC topology 600 also includes the third multiplier 524 having: a first input coupled to an output of the buffer circuit 502 and configured to receive the buffered signal; and a second input coupled to the +/−1 PRBS generator 506 and configured to receive a PRBS value (PRBS1) from the +/−1 PRBS generator 506. In FIG. 6, the +/−1 PRBS generator 506, the third multiplier 524 and the fourth multiplier 534 are components of chopper circuitry (e.g., the chopper circuitry 228 in FIGS. 2A and 2B) for the second ADC of the ADC topology 600. As shown, the output of the third multiplier 524 is coupled to the second set of comparators 528 (an example of threshold proximity detect components of the threshold proximity detect circuitry 238 in FIG. 2B). The second set of comparators 528 are configured provide N comparison results to the second folding circuit 530 based on a sample (of the output of the third multiplier 524) and respective reference thresholds. In FIG. 6, the second folding circuitry 530 is configured to perform a mapping to convert the N comparison results to a delay domain signal. In other example embodiments, the second folding circuit 530 is configured to perform a mapping to convert the N comparison results to a folding interpolation signal. In FIG. 6, the delay domain signal from the second folding circuit 530 is provided to the second digitization circuitry 532, which converts the delay domain signal to a digital output code. The second digitization circuitry 532 provides the digital output code to the fourth multiplier 534, which multiplies the digital output code by a PRBS value (PRBS1) received from the +/−1 PRBS generator 506. The output from the multiplier 534 is a digital output $y_1$ of the second ADC of the ADC topology 600.

In some example embodiments (including the example of FIG. 6), the ADC topology 600 includes the averaging circuit 518 coupled to the output of the second multiplier 514 and the output of the fourth multiplier 534. The output of the averaging circuit 518 is the digital output code of the ADC topology 600. With the averaging circuit 518, the noise level of the overall output for the ADC topology 600 is improved by approximately 3 dB. Without such averaging, the SNR of the ADC topology 600 is reduced by approximately 3 dB. In some example embodiments, the output of the first digitization circuitry 512 and the second digitization circuitry 532 is provided to threshold proximity detect circuitry 615 (an example of at least some of the threshold proximity detect circuitry 238 in FIG. 2B). The threshold proximity detect circuitry 615 is configured to detect when a sample of the first set of comparators 508 is proximate to a respective reference threshold related to the first set of comparators 508 based on the outputs of the first digitization circuitry 512 and the second digitization circuitry 532. For example, if the outputs of the first digitization circuitry 512 and the second digitization circuitry 532 differ, the threshold proximity detect circuitry 615 may determine that the sample is proximate to a respective reference threshold related to the first set of comparators 508. In response to a threshold proximity detection, the threshold proximity detect circuitry 615 is configured to provide an enable signal to the calibration control circuitry 616.

In the example of FIG. 6, the threshold proximity detect circuitry 615 is configured to receive the digital output codes of the first digitization circuitry 512 and the second digitization circuitry 532. As another option, the comparison results of the first set of comparators 508 and the comparison results of the second set of comparators 528 could be used for threshold proximity detection (as in FIG. 4). As another option, the outputs of the second multiplier 514 and the outputs of the fourth multiplier 534 could be used for threshold proximity detection (as in FIG. 5). As another option, the threshold proximity detect circuitry 615 may use only the digital output codes or comparison results of the second digitization circuitry 532 in combination with a predetermined threshold proximity detection range. If the sample is determined to be proximate to one of the respective reference thresholds of the first set of comparators 508, the threshold proximity detect circuitry 615 is configured to assert an enable signal to a calibration control circuit 616 (e.g., a combination of the offset error estimation circuit 244 and the calibration estimation circuit 252 in FIGS. 2A and 2B). In the example of FIG. 6, the calibration control circuit 616 also receives the digital outputs $y_0$ and $y_1$ and related PRBS values. Together, the calibration control circuitry 616, the threshold proximity detect circuitry 615, and components of the second ADC in the ADC topology 600 are an example of the calibration circuitry 230 of FIG. 2B.

In response to receiving the enable signal from the threshold proximity detect circuitry 615, the calibration control circuit 616 is configured to perform offset error estimation. If the estimated offset error is greater than an offset error threshold, the calibration control circuit 616 is configured to perform comparator input offset calibration operations. In some example embodiments, the offset error is estimated by the calibration control circuit 616 as:

$$\text{offset error} = E(y_1 - y_0, \text{prbs}=1) - E(y_1 - y_0, \text{prbs}=-1), \quad (5)$$

where $E(y_1-y_0, \text{prbs}=1)$ is the expectation or mean in the digital output code of the first ADC minus a digital output code of the second ADC when the PRBS value is 1, and $E(y_1-y_0, \text{prbs}=-1)$ is the expectation or mean in the digital output code of the first ADC minus the digital output code of the second ADC when the PRBS value is -1. In some example embodiments, the expectation or mean in the digital output code of the first ADC of the ADC topology 600 is determined by integrating the effect of applying a given PRBS value to samples input to the first ADC over time. Also, the expectation or mean in the digital output code of the second ADC of the ADC topology 600 is determined by integrating the effect of applying a given PRBS value to samples for the second ADC over time. Compared to the ADC topologies 400 and 500, the number of samples needed to perform offset error estimation for the ADC topology 600 is reduced, which increases the comparator input offset calibration bandwidth of the ADC topology 600 (e.g., calibration can be performed more often or is performed in less time) relative to the comparator input offset calibration bandwidth of the ADC topologies 400 and 500. This bandwidth improvement for ADC topology 600 is achieved because the calibration control circuit 616 is configured to use ADC values related to both the first ADC and the second ADC for offset error estimation instead of just ADC values related to a first ADC as in the ADC topologies 400 and 500 of FIGS. 4 and 5.

If the estimated offset error is greater than an offset error threshold, comparator input offset calibration is performed. In some example embodiments, comparator input offset calibration is based on a scaled and accumulated version of the offset error estimate attributable to each comparator being calibrated. When performed, comparator input offset calibration or correction may adjust one or more comparator parameters (e.g., a positive or negative offset may be applied to the analog signal sample and/or to the respective reference threshold for a given comparator). Example circuitry for applying a positive or negative offset to the sample and/or to a respective reference threshold is an adjustable voltage source, where the control signal for the adjustable voltage source is the comparator input offset calibration signal or is adjusted by the comparator input offset calibration signal.

In some example embodiments, comparator input offset calibration for the ADC topology 600 is performed in the background periodically (e.g., based on a timer or counter). As another option, calibration of comparator input offset for the ADC topology 600 is performed as an initial calibration to start ADC operations with corrected offsets. In some example embodiments, offset error estimation and related comparator input offset calibration operations may be performed in combination with linearity error calibration (a calibration to determine an inverse mapping to address nonlinearity) as well as linearity error correction (the application of chopper values).

Figure 7:
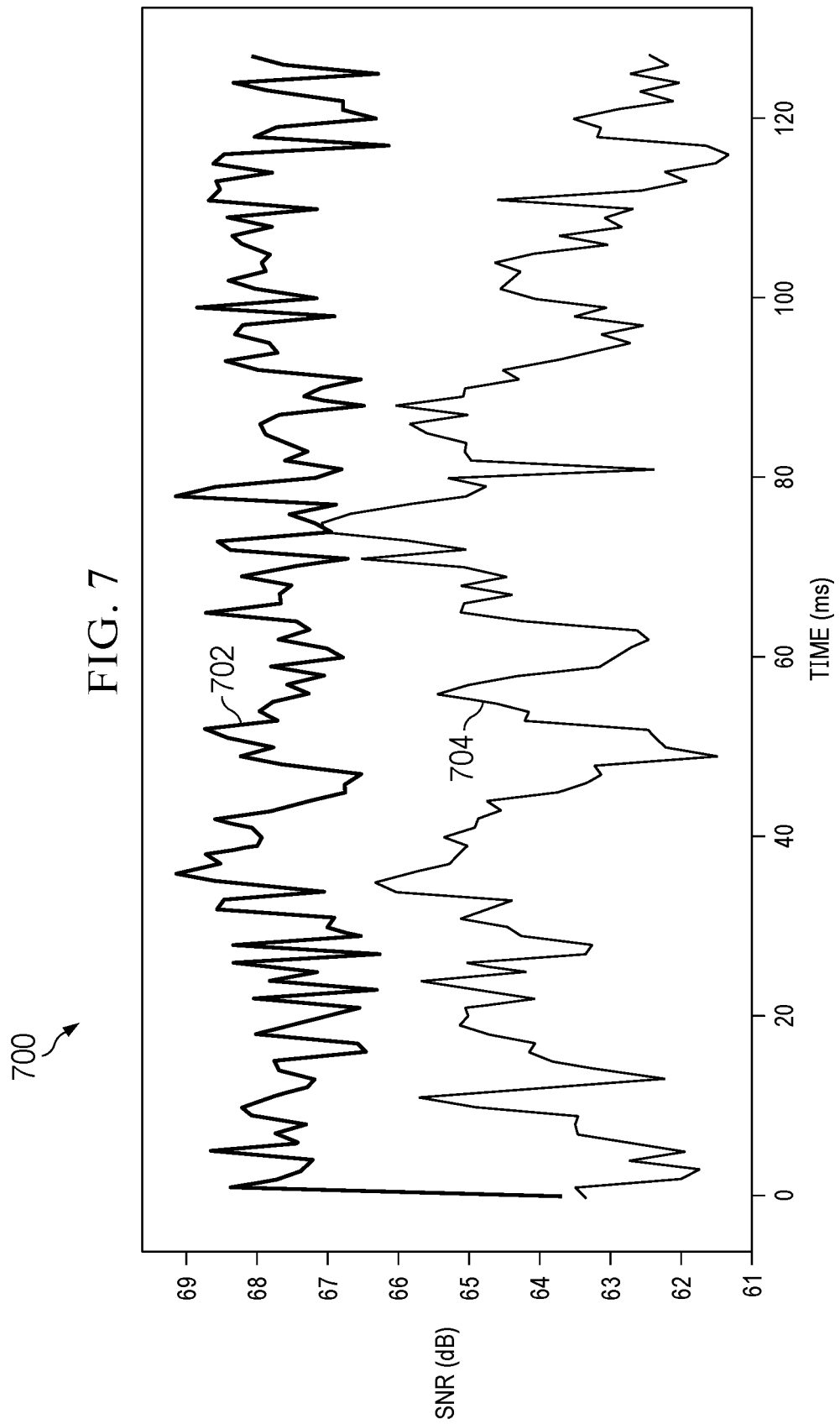
FIG. 7 is a graph of ADC signal-to-noise ratio (SNR) as a function of time with and without calibration in accordance with example embodiments.

FIG. 7 is a graph 700 of ADC SNR as a function of time with and without calibration in accordance with example embodiments. With ADC SNR waveform 702 of graph 700, chopper circuitry operations and comparator input offset calibration operations are performed as described herein. In contrast, with ADC SNR waveform 704 of graph 700 (representative of ADC SNR of the conventional delay domain ADC topology 100 of FIG. 1), chopper circuitry operations are performed without comparator input offset calibration. Without comparator input offset calibration, the ADC SNR waveform 704 has a SNR that is lower on average compared to the ADC SNR waveform 702. A lower ADC SNR results in poor noise performance, which means the ADC may not meet the target system criteria.

Figure 8:
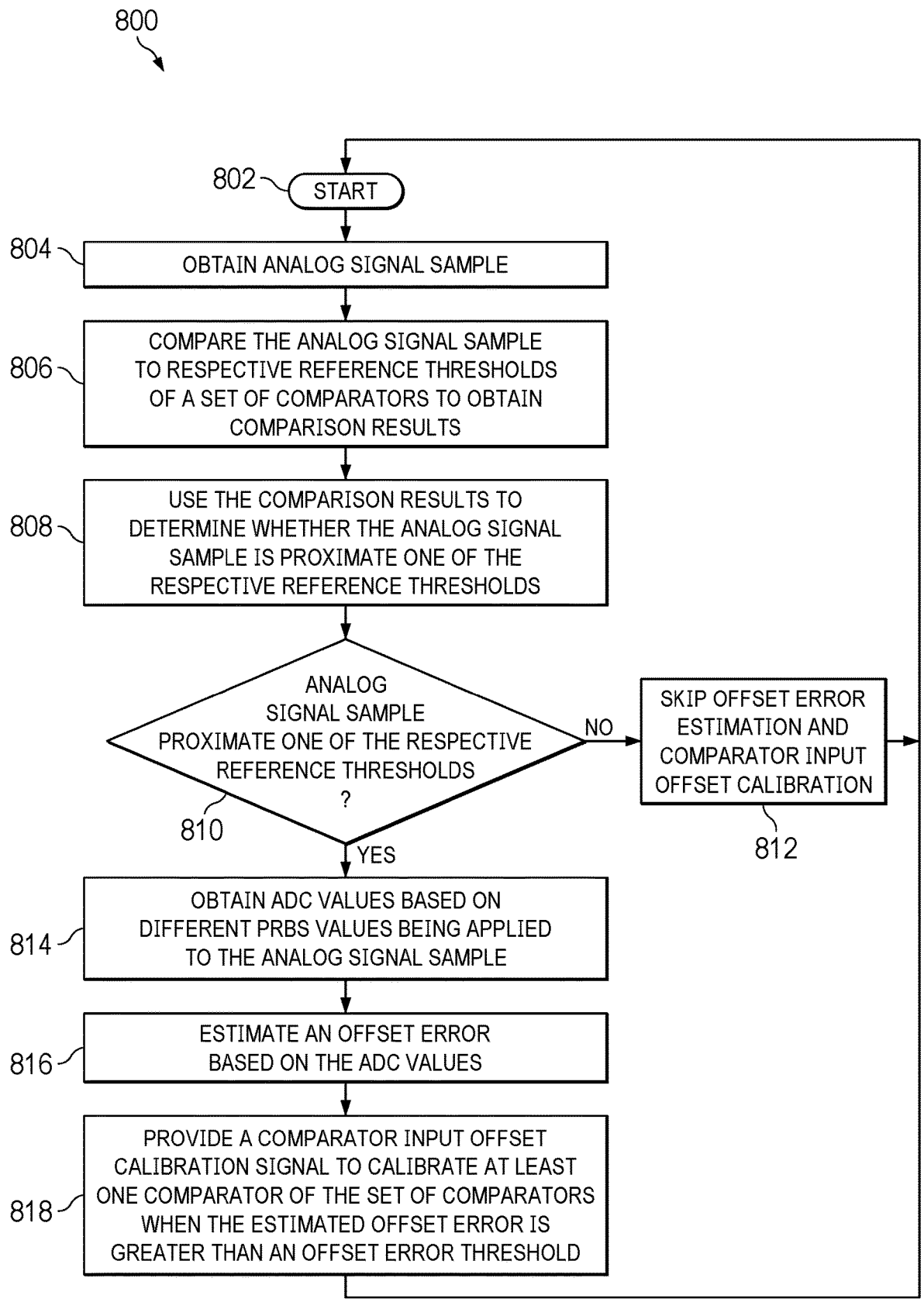
FIG. 8 is a flowchart showing a method of calibrating ADC comparators to account for flicker noise in accordance with an example embodiment.

FIG. 8 is a flowchart showing a method 800 of calibrating ADC comparators in accordance with an example embodiment. The method 800 is performed, for example, by calibration circuitry components of the ADC 200 in FIG. 2A (e.g., components of stages 271, 276, and 280), the ADC 206 in FIG. 2B, the ADC topology 400 in FIG. 4, the ADC topology 500 in FIG. 5, or the ADC topology 600 in FIG. 6. As shown, the method 800 starts at block 802. At block 804, an analog signal sample is obtained (e.g., by sampling circuitry of each comparator at a rate determined by the clock signal for the ADC). At block 806, the analog signal sample is compared to respective reference thresholds of a set of comparators to obtain comparison results. At block 808, the comparison results are used to determine whether the analog signal sample is proximate to one of the respective reference thresholds. If the analog signal sample is proximate to one of the respective reference thresholds (determination block 810), ADC values based on different PRBS values being applied to the analog signal sample are obtained at block 814. At block 816, an offset error based on the ADC values is estimated. At block 818, a comparator input offset calibration signal is provided to calibrate the input offset at least one comparator of the set of comparators when the estimated offset error is greater than an offset error threshold. After block 818, the method 800 returns to block 802. If the analog signal sample is not proximate to one of the respective reference thresholds (determination block 810), comparator input offset calibration is skipped. The method 800 may be performed as an initial calibration or as a periodic calibration to compensate for offset error due to a comparator's input offset. As described herein, such offset error may vary over time and is a function of comparator flicker noise, dither noise, and sample value. With the strategy described herein, offset error estimation and related comparator input offset calibration operations are avoided unless a sample is detected to be proximate to a respective reference threshold (where offset error is at or near a positive or negative peak as described in FIG. 3). In other words, offset error estimation and related comparator input offset calibration operations may be avoided until a suitable target sample value for offset error estimation is detected.

In some example embodiments, the set of comparators related to method 800 is a first set of comparators, the comparison results are first comparison results, and determining if the analog signal sample is proximate to one of the respective reference thresholds includes: obtaining second comparison results by a second set of comparators; and determining that the analog signal sample is proximate to one of the respective reference thresholds if the first comparison results and the second comparison results differ. In some example embodiments, obtaining the ADC values at block 814 includes: obtaining a first set of digital output codes related to the first set of comparators as a first set of ADC values; obtaining a second set of digital output codes related to the second set of comparators as a second set of ADC values; and estimating the offset error based on the first set of ADC values and the second set of ADC values. In some example embodiments, obtaining the ADC values at block 814 includes: averaging a first set of ADC values related to the first set of comparators; averaging a second set of ADC values related to the second set of comparators; and estimating the offset error based on the averaged first set of ADC values and the averaged second set of ADC values.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Unless otherwise stated, "about," "approximately," or "substantially" preceding a value means +/−10 percent of the stated value, or, if the value is zero, a reasonable range of values around zero. Modifications are possible in the described embodiments, and other embodiments are possible, within the scope of the claims.

What is claimed is:
1. An analog-to-digital converter (ADC) comprising:
 a set of comparators, each comparator of the set of comparators having a first input, a second input and an output, the set of comparators configured to:
  receive an analog signal at each of the first inputs;
  receive at the second input for each comparator of the set of comparators a respective reference threshold; and provide comparison results at each output based on the analog signal and the respective reference thresholds;

digitization circuitry having a digitization circuitry input and a digitization circuitry output, the digitization circuitry input is coupled to each of the outputs, and the digitization circuitry is configured to provide a digital output code at the digitization circuitry output based on the comparison results and a mapping; and calibration circuitry having a first calibration circuitry input, a second calibration circuitry input and a calibration circuitry output, the calibration circuitry configured to:

receive the comparison results at the first calibration circuitry input;

determine if the analog signal is proximate to one of the respective reference thresholds based on the comparison results;

in response to determining the analog signal is proximate to one of the respective reference thresholds, receive ADC values at the second calibration circuitry input, the ADC values based on different pseudorandom binary sequence (PRBS) values being applied to the analog signal;

estimate an offset error based on the ADC values; and provide a comparator input offset calibration signal at the calibration circuitry output if the estimated offset error is greater than an offset error threshold.

2. The ADC of claim 1, wherein the set of comparators is a first set of comparators, the calibration circuitry includes a second set of comparators, each comparator of the second set of comparators having a first input, a second input and an output, the second set of comparators configured to:

receive the analog signal at each respective first input of each comparator of the second set of comparators;

receive at the second input for each comparator of the second set of comparators a respective reference threshold; and provide comparison results at each output of each comparator of the second set of comparators based on the analog signal and the respective reference thresholds, wherein the calibration circuitry is configured to determine that the analog signal is proximate to one of the respective reference thresholds of the first set of comparators when the comparison results of the first set of comparators differ from comparison results of the second set of comparators.

3. The ADC of claim 2, wherein the ADC is a first ADC, and the calibration circuitry includes a second ADC having the second set of comparators.

4. The ADC of claim 2, wherein the ADC values are a first set of ADC values obtained using the first set of comparators, and the calibration circuitry is configured to:

determine a second set of ADC values using the second set of comparators and based on the different PRBS values being applied to the analog signal; and estimate the offset error based on the first and second sets of ADC values.

5. The ADC of claim 4, wherein the calibration circuitry is configured to:

average the first set of ADC values to obtain a first average value;

average the second set of ADC values to obtain a second average value; and estimate the offset error based on the first and second average values.

6. The ADC of claim 1, wherein the received ADC values are digital output codes provided by the digitization circuitry based on the different PRBS values being applied to the analog signal.

7. The ADC of claim 1, wherein the calibration circuitry includes a third calibration circuitry input and threshold proximity detect circuitry having a first threshold proximity detect circuitry input, a second threshold proximity detect circuitry input and a threshold proximity detect circuitry output, the first threshold proximity detect circuitry input coupled to the first calibration circuitry input, the second threshold proximity detect circuitry input coupled to the third calibration circuitry input, and threshold proximity detect circuitry configured to:

receive the analog signal at the second threshold proximity detect circuitry input;

receive the comparison results at the second threshold proximity detect circuitry input;

determine if the analog signal is proximate to one of the respective reference thresholds based on the analog signal and the comparison results; and provide an enable signal at the threshold proximity detect circuitry output in response to determining that the analog signal is proximate to one of the respective reference thresholds.

8. The ADC of claim 7, wherein the threshold proximity detect circuitry output is a first threshold proximity detect circuitry output, the threshold proximity detect circuitry includes a second threshold proximity detect circuitry output, and threshold proximity detect circuitry is configured to provide proximity results at the second threshold proximity detect circuitry output in response to determining that the analog signal is proximate to one of the respective reference thresholds.

9. The ADC of claim 8, wherein the calibration circuitry includes a fourth calibration circuitry input and offset error estimation circuitry having a first offset error estimation circuitry input, a second offset error estimation circuitry input; a third offset error estimation circuitry input, a fourth offset error estimation circuitry input and an offset error estimation circuitry output, the first offset error estimation circuitry input coupled to the first threshold proximity detect circuitry output, the second offset error estimation circuitry input coupled to the second threshold proximity detect circuitry output, the second offset error estimation circuitry input coupled to the second calibration circuitry input, the fourth offset error estimation circuitry input coupled to the fourth calibration circuitry input, and the offset error estimation circuitry configured to:

receive the enable signal at the first offset error estimation circuitry input;

receive the proximity results at the second offset error estimation circuitry input;

receive the ADC values at the third offset error estimation circuitry input;

receive PRBS values at the fourth offset error estimation circuitry input;

estimate the offset error based on the enable signal, the proximity results, the ADC values and the PRBS values; and provide offset error results at the offset error estimation circuitry output.

10. The ADC of claim 9, wherein the calibration circuitry includes calibration estimation circuitry having a calibration estimation circuitry input and a calibration estimation circuitry output, the calibration estimation circuitry input coupled to the offset error estimation circuitry output, the calibration estimation circuitry output coupled to the calibration circuitry output, the calibration estimation circuitry configured to provide the comparator input offset calibration signal at the calibration estimation circuitry output when the offset error results indicate the offset error is greater than the offset error threshold.

11. The ADC of claim 1, wherein the mapping is a delay domain mapping.

12. The ADC of claim 1, wherein the mapping is a folding interpolation mapping.

13. A an analog-to-digital converter (ADC) comprising:
a first set of comparators configured to receive an analog signal and to provide first comparison results based on the analog signal and respective reference thresholds for comparators of the first set of comparators;
digitization circuitry coupled to an output of the first set of comparators and configured to provide a digital output code based on the comparison results and a mapping;
a second set of comparators configured to receive the analog signal and to provide second comparison results based on the analog signal and respective reference thresholds for comparators of the second set of comparators; and
calibration circuitry coupled to the first set of comparators and the second set of comparators, the calibration circuitry configured to:
receive the first and second comparison results;
determine if the analog signal is proximate to one of the respective reference thresholds based on the first and second comparison results;
in response to determining the analog signal is proximate to one of the respective reference thresholds, obtain ADC values based on different pseudorandom binary sequence (PRBS) values being applied to the analog signal;
estimate an offset error based on the ADC values; and
provide a comparator input offset calibration signal for at least one comparator of the set of comparators responsive to the estimated offset error being greater than an offset error threshold.

14. The circuit of claim 13, wherein the offset error is estimated as: offset error=$E(y_{1,prbs=1})-E(y_{1,prbs=-1})$, where $E(y_{1,prbs=1})$ is the expectation or mean in the digital output code provided by the digitization circuitry for the analog signal when the PRBS value=1, and $E(y_{1,prbs=-1})$ is the expectation or mean in the digital output code provided by the digitization circuitry for the analog signal when the PRBS value=−1.

15. The circuit of claim 13, wherein the ADC is a first ADC, the calibration circuitry includes a second ADC in parallel with the first ADC, the second ADC includes the second set of comparators, and the offset error is estimated as: offset error=$E(y_{1,prbs=1})-E(y_{1,prbs=-1})$, where $E(y_{1,prbs=1})$ is the expectation or mean in the digital output code of the first ADC for the analog signal when the PRBS value=1, and $E(y_{1,prbs=-1})$ is the expectation or mean in the digital output code of the first ADC for the analog signal when the PRBS value=−1.

16. The circuit of claim 13, wherein the ADC is a first ADC, the calibration circuit includes a second ADC in parallel with the first ADC, the second ADC includes the second set of comparators, and the offset error is estimated as: offset error=$E(y_1-y_0, prbs=1)-E(y_1-y_0,prbs=-1)$, where $E(y_1-y_0, prbs=1)$ is the expectation or mean in the digital output code of the first ADC minus a digital output code of the second ADC for the analog signal when the PRBS value=1, and $E(y_1-y_0,prbs=-1)$ is the expectation or mean in the digital output code of the first ADC minus the digital output code of the second ADC for the analog signal when the PRBS value=−1.

17. A method of operating an analog-to-digital converter (ADC), comprising:
obtaining, by the ADC, an analog signal;
comparing, by the ADC, the analog signal to respective reference thresholds of a set of comparators of the ADC to obtain comparison results;
determining if the analog signal is proximate to one of the respective reference thresholds based on the comparison results;
obtaining ADC values based on different pseudorandom binary sequence (PRBS) values being applied to the analog signal responsive to the analog signal being proximate to one of the respective reference thresholds;
determining an offset error based on the ADC values; and
providing a comparator input offset calibration signal to calibrate at least one comparator of the set of comparators responsive to the estimated offset error being greater than an offset error threshold.

18. The method of claim 17, wherein the set of comparators is a first set of comparators, the comparison results are first comparison results, and determining if the analog signal is proximate to one of the respective reference thresholds includes:
comparing the analog signal to respective reference thresholds of a second set of comparators to obtain second comparison results; and
determining that the analog signal is proximate to one of the respective reference thresholds if the first comparison results and the second comparison results differ.

19. The method of claim 18, wherein obtaining the ADC values includes:
obtaining a first set of digital output codes related to the first set of comparators as a first set of ADC values;
obtaining a second set of digital output codes related to the second set of comparators as a second set of ADC values; and
estimating the offset error based on the first set of ADC values and the second set of ADC values.

20. The method of claim 18, wherein obtaining the ADC values includes:
averaging a first set of ADC values related to the first set of comparators;
averaging a second set of ADC values related to the second set of comparators; and
estimating the offset error based on the averaged first set of ADC values and the averaged second set of ADC values.

* * * * *